US008455161B2

(12) United States Patent
Asai et al.

(10) Patent No.: US 8,455,161 B2

(45) Date of Patent: Jun. 4, 2013

(54) METHOD FOR ERASING IMAGE ON THERMOREVERSIBLE RECORDING MEDIUM

(75) Inventors: Toshiaki Asai, Numazu (JP); Tomomi Ishimi, Numazu (JP); Shinya Kawahara, Numazu (JP); Yoshihiko Hotta, Mishima (JP)

(73) Assignee: Ricoh Company, Ltd., Tokyo (JP)

( * ) Notice: Subject to any disclaimer, the term of this patent is extended or adjusted under 35 U.S.C. 154(b) by 683 days.

(21) Appl. No.: 12/559,714

(22) Filed: Sep. 15, 2009

(65) Prior Publication Data

US 2010/0069238 A1 Mar. 18, 2010

(30) Foreign Application Priority Data

Sep. 17, 2008 (JP) ................................ 2008-238001

(51) Int. Cl.

*G03F 7/00* (2006.01)
*G03F 7/20* (2006.01)
*B41J 2/435* (2006.01)

(52) U.S. Cl.

USPC .......... 430/19; 430/270.1; 430/945; 347/224; 347/225

(58) Field of Classification Search

USPC ................. 430/270.1, 19, 945; 347/224, 225, 347/232, 236, 237

See application file for complete search history.

(56) References Cited

U.S. PATENT DOCUMENTS

| | | | | |
|---|---|---|---|---|
| 5,249,000 | A | 9/1993 | Okabe et al. | |
| 7,238,642 | B2 | 7/2007 | Shimbo et al. | |
| 7,338,919 | B2 | 3/2008 | Kawahara et al. | |
| 7,422,996 | B2 | 9/2008 | Shimbo et al. | |
| 7,439,993 | B2 | 10/2008 | Ishimi et al. | |
| 7,456,132 | B2 | 11/2008 | Yamamoto et al. | |
| 7,585,813 | B2 | 9/2009 | Shimbo et al. | |
| 8,098,266 | B2 * | 1/2012 | Asai et al. | 347/171 |

(Continued)

FOREIGN PATENT DOCUMENTS

| | | | |
|---|---|---|---|
| CN | 101219608 | A | 7/2008 |
| EP | 1752298 | A1 | 2/2007 |

(Continued)

OTHER PUBLICATIONS

Sep. 14, 2010 Chinese official action (English translation enclosed) in connection with a counterpart Chinese patent application.

(Continued)

*Primary Examiner* — Amanda C. Walke

(74) *Attorney, Agent, or Firm* — Cooper & Dunham LLP

(57) ABSTRACT

A method for erasing an image including irradiating an image formed on a thermoreversible recording medium with a laser light having a wavelength of 700 nm to 1,500 nm so as to erase the image, wherein an energy density of the laser light is in a range of the energy density which can erase the image and a center value or less of the range, wherein the thermoreversible recording medium includes a support, and a thermoreversible recording layer on the support, and wherein the thermoreversible recording layer contains a leuco dye serving as an electron-donating color-forming compound and a reversible developer serving as an electron-accepting compound, in which color tone reversibly changes by heat, and at least one of the thermoreversible recording layer and a layer adjacent to the thermoreversible recording layer contains a photothermal conversion material, which absorbs the light and converts the light into heat.

8 Claims, 7 Drawing Sheets

U.S. PATENT DOCUMENTS

| | | | | |
|---|---|---|---|---|
| 8,101,334 | B2 * | 1/2012 | Ishimi et al. | 430/270.1 |
| 8,106,934 | B2 * | 1/2012 | Ishimi et al. | 347/224 |
| 2007/0036039 | A1 | 2/2007 | Kawahara et al. | |
| 2007/0225162 | A1 | 9/2007 | Kawahara et al. | |
| 2008/0151033 | A1 | 6/2008 | Ishimi et al. | |
| 2008/0153698 | A1 | 6/2008 | Kawahara et al. | |
| 2008/0214391 | A1 | 9/2008 | Kawahara et al. | |

FOREIGN PATENT DOCUMENTS

| | | |
|---|---|---|
| EP | 1752298 A1 * | 2/2007 |
| JP | 5-8537 | 1/1993 |
| JP | 9-30118 | 2/1997 |
| JP | 11-151856 | 6/1999 |
| JP | 2000-136022 | 5/2000 |
| JP | 3161199 | 2/2001 |
| JP | 3357998 | 10/2002 |
| JP | 2004-265247 | 9/2004 |
| JP | 2004-265249 | 9/2004 |
| JP | 2005-262798 | 9/2005 |
| JP | 3790485 | 4/2006 |
| JP | 3836901 | 8/2006 |
| JP | 3998193 | 8/2007 |

OTHER PUBLICATIONS

Jan. 29, 2010 European search report in connection with counterpart European patent application No. 09 17 0398.

* cited by examiner

METHOD FOR ERASING IMAGE ON THERMOREVERSIBLE RECORDING MEDIUM

BACKGROUND OF THE INVENTION

1. Field of the Invention

The present invention relates to a method for erasing an image, in which the image is uniformly erased using a laser light and background fog on a thermoreversible recording medium caused by repetitive image erasure is reduced.

2. Description of the Related Art

Each image has been so far recorded and erased on a thermoreversible recording medium (hereinafter, may be referred to as "recording medium" or "medium") by a contact method in which the thermoreversible recording medium is heated by making contact with a heat source. For the heat source, in the case of image recording, a thermal head is generally used, and in the case of image erasing, a heat roller, a ceramic heater or the like is generally used.

Such a contact image processing method has advantages in that when a thermoreversible recording medium is composed of a flexible material such as film and paper, an image can be uniformly recorded and erased by evenly pressing a heat source against the thermoreversible recording medium with use of a platen, and an image recording device and an image erasing device can be produced at cheap cost by using components of a conventional thermosensitive printer.

However, when a thermoreversible recording medium incorporates an RF-ID tag as described in Japanese Patent Application Laid-Open (JP-A) Nos. 2004.265247 and 2004-265249, the thickness of the thermoreversible recording medium is thickened and the flexibility thereof is degraded. Therefore, to uniformly press a heat source against the thermoreversible recording medium, it needs a high-pressure.

Moreover, in the contact type, a surface of the recording medium is scraped due to repetitive printing and erasure and irregularity is formed thereon, and some parts are not in contact with a heating source such as a thermal head or hot stamping. Thus, the recording medium may not be uniformly heated, causing decrease of image density or erasure failure. In particular, when erasure is performed at a low temperature in the range of the temperature at which an image can be erased, a part of the recording medium which is hard to come into contact with the heating source is not easily heated at the erasing temperature, causing erasure failure easily (Japanese Patent (JP-B) No. 3161199 and Japanese Patent Application Laid-Open (JP-A) No. 09-30118).

In view of the fact that RF-ID tag enables reading and rewriting of memory information from some distance away from a thermoreversible recording medium in a non-contact manner, a demand arises for thermoreversible recording media as well. The demand is that an image be rewritten on such a thermoreversible recording medium from some distance away from the thermoreversible recording medium. To respond to the demand, a method using a laser is proposed as a method of forming and erasing each image on a thermoreversible recording medium from some distance away from the thermoreversible recording medium when there are irregularities on the surface thereof (see JP-A No. 2000-136022).

It is the method by which non-contact recording is performed by using thermoreversible recording media on shipping containers used for physical distribution lines. Writing is performed by using a laser and erasing is performed by using a hot air, heated water, infrared heater, etc, but not by using a laser.

As such a recording method using a laser, a recording device (laser maker) is proposed of which a thermoreversible recording medium is irradiated with a high-power laser light to control the irradiation position. A thermoreversible recording medium is irradiated with a laser light using the laser marker, and a photothermal conversion material in the recording medium absorbs light so as to convert it into heat, which can record and erase the image. An image forming and erasing method using a laser has been proposed, wherein a recording medium including a leuco dye, a reversible developer and various photothermal conversion materials in combination is used, and recording is performed thereon using a near infrared laser light (see, JP-A Nos. 05-8537 and 11-151856).

However, occurrence of background fog is concerned in such thermoreversible recording medium (For example, see JP-B Nos. 3836901 and 3998193, and JP-A No. 2005-262798). Moreover, when repetitive erasure is performed on a thermoreversible recording medium using a high-output laser light, background fog occurs, causing decrease in contrast.

The decrease in contrast due to the background fog causes various problems such as trouble in reading barcode.

JP-B No. 3790485 proposes a solution to the background fog in which erasure is performed at a laser irradiation time shorter than that upon recording. However, when image processing is performed in a wide area of a thermoreversible recording medium, or when image processing is performed on a thermoreversible recording medium used for a shipping container which is employed in a physical distribution line in a non-contact manner, there exists problems, for example, an image is not sufficiently erased due to energy shortage of a laser light depending on a degradation state of the medium, a distance between the medium and an image recording device on which a laser light source is mounted, and a traveling speed of the thermoreversible recording medium in the line.

Thus, a method for controlling an energy to the thermoreversible recording medium only upon image erasure is necessary, in order to uniformly erase the image, and to obtain a clear contrast image by inhibiting occurrence of background fog.

JP-B No. 3161199 discloses an image erasing method in which an image is erased with an energy lower than the center value of the range of the energy which can erase the image on the thermoreversible recording material upon erasing the image, as an image erasure technique using a thermal head or hot stamping.

However, although the image erasure technique is applied to the thermoreversible recording medium containing a photothermal conversion material, on which an image can be erased by a laser light, the background fog cannot be sufficiently prevented.

BRIEF SUMMARY OF THE INVENTION

The present invention solves the above problems and aimed to achieve the following object. An object of the present invention is to provide a method for erasing an image including irradiating an image formed on a thermoreversible recording medium with a laser light having a wavelength of 700 nm to 1,500 nm so as to heat, thereby erasing the image, wherein an energy density of the laser light is in a range of the energy density which can erase the image and a center value or less of the range of the energy density, wherein the thermoreversible recording medium includes a support, and a thermoreversible recording layer on the support, and wherein the thermoreversible recording layer contains a leuco dye serving as an electron-donating color-forming compound and a reversible developer serving as an electron-accepting compound, in which color tone reversibly changes by heat, and at least one of the thermoreversible recording layer and a layer adjacent to the thermoreversible recording layer contains a photothermal conversion material, which absorbs the light having a specific wavelength and converts the light into heat, and the method is capable of uniformly erasing the image, and reducing the background fog on the thermoreversible recording medium caused by repetitive image erasure, regardless of the degradation state of the thermoreversible recording medium.

Means for solving the problems are as follows:

<1> A method for erasing an image including irradiating an image formed on a thermoreversible recording medium with a laser light having a wavelength of 700 nm to 1,500 nm so as to erase the image, wherein an energy density of the laser light is in a range of the energy density which can erase the image and a center value or less of the range of the energy density, wherein the thermoreversible recording medium includes a support, and a thermoreversible recording layer on the support, and wherein the thermoreversible recording layer contains a leuco dye serving as an electron-donating color-forming compound and a reversible developer serving as an electron-accepting compound, in which color tone reversibly changes by heat, and at least one of the thermoreversible recording layer and a layer adjacent to the thermoreversible recording layer contains a photothermal conversion material, which absorbs the light and converts the light into heat.

<2> The method for erasing an image according to <1>, wherein a laser light source used in the irradiating the image is a semiconductor laser.

<3> The method for erasing an image according to any one of <1> to <2>, wherein the photothermal conversion material in the thermoreversible recording medium is a material having an absorption peak in a near infrared region.

<4> The method for erasing an image according to any one of <1> to <3>, wherein the thermoreversible recording medium is irradiated with the laser light so as to form the image thereon, and a light intensity $I_1$ of the center portion and a light intensity $I_2$ at the 80% plane of a total irradiation energy of the laser light in a light intensity distribution satisfy the relationship of $0.40 \leqq I_1/I_2 \leqq 2.00$.

<5> The method for erasing an image according to any one of <1> to <4>, wherein the image on the thermoreversible recording medium is erased while the thermoreversible recording medium is moved.

<6> The method for erasing an image according to any one of <1> to <5>, wherein the image is erased with an energy density of 1 to 4, provided that a minimum energy density value which can erase the image is 0, and a maximum energy density value which can erase the image is 10.

<7> The method for erasing an image according to any one of <1> to <6>, wherein an output of the laser light applied in the irradiating the image is 5 W to 200 W.

<8> The method for erasing an image according to any one of <1> to <7>, wherein a scanning velocity of the laser light applied in the irradiating the image is 100 mm/s to 20,000 mm/s.

<9> The method for erasing an image according to any one of <1> to <8>, wherein a spot diameter of the laser light applied in the irradiating the image is 0.5 mm to 14 mm.

<10> An image erasing device including a laser light emitting unit configured to emit a laser light to a thermoreversible recording layer, and a light scanning unit which is arranged in a path of the laser light emitted from the laser light emitting unit so as to change the path and is configured to scan the thermoreversible recording layer with the laser light, wherein the image erasing device is used in the method for erasing an image according to any one of <1> to <9>.

According to the present invention, a method for erasing an image is capable of uniformly erasing the image, and reducing the background fog on the thermoreversible recording medium caused by repetitive image erasure, regardless of the degradation state of the thermoreversible recording medium, and the method includes irradiating an image formed on a thermoreversible recording medium with a laser light having a wavelength of 700 nm to 1,500 nm so as to heat, thereby erasing the image, wherein an energy density of the laser light is in a range of the energy density which can erase the image and a center value or less of the range of the energy density, wherein the thermoreversible recording medium includes a support, and a thermoreversible recording layer on the support, and wherein the thermoreversible recording layer contains a leuco dye serving as an electron-donating color-forming compound and a reversible developer serving as an electron-accepting compound, in which color tone reversibly changes by heat, and at least one of the thermoreversible recording layer and a layer adjacent to the thermoreversible recording layer contains a photothermal conversion material, which absorbs the light having a specific wavelength and converts the light into heat.

Figure 1:
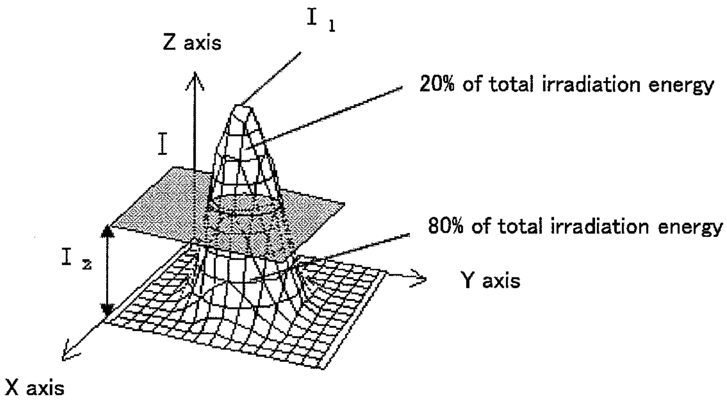
FIG. 1 is a schematic explanatory diagram showing one example of the light intensity distribution of a laser light used in the present invention.

DETAILED DESCRIPTION OF THE INVENTION (Image Erasing Method)

An image erasing method of the present invention includes at least an image erasing step, and further includes an image forming step, and if necessary, other steps suitably selected in accordance with the necessity.

(Image Erasing Step)

An image is formed by heating on a thermoreversible recording medium including a support, a thermoreversible recording layer on the support, wherein the thermoreversible recording layer contains a leuco dye serving as an electron-donating color-forming compound and a reversible developer serving as an electron-accepting compound, in which color tone reversibly changes by heat, and a photothermal conversion material which absorbs a light and converts the light into heat is contained in at least one of the thermoreversible recording layer and a layer adjacent to the thermoreversible recording layer. In the case where the image is repeatedly erased by an image erasing method in which a thermoreversible recording medium is irradiated with a laser light having a specific wavelength to heat a recording layer, thereby erasing an image (erasure by means of a semiconductor laser light, YAG laser light, or the like), background fog easily occurs in an erased portion, compared with an image erasing method, in which a surface of a thermoreversible recording medium is heated so as to heat a recording layer, thereby erasing an image (erasure by means of a $CO_2$ laser light, hot stamping, ceramic heater, thermal head, heat roller, heat block or the like).

It is considered that the easiness of occurrence of the background fog by the repetitive erasure is caused by difference in cooling rate of the recording layer between the methods. When an image formed on the thermoreversible recording medium by heating is erased by the image erasing method of irradiating the medium with a laser light having a specific wavelength to heat a recording layer, only the recording layer containing the photothermal conversion material or only the recording layer and a layer containing the photothermal conversion material adjacent to the recording layer are heated. Thus, after image processing, heat is diffused to upper and lower layers of the heated layer(s), so that the recording layer is rapidly cooled.

On the other hand, when an image is erased by the image erasing method of heating the surface of the thermoreversible recording medium by means of a thermal head, hot stamping or the like, the recording layer or a layer located above the recording layer is in contact with the thermal head, hot stamping or the like, so as to be heated. Thus, after image processing, heat is diffused to lower layers of the heated layer, so that the recording layer is slowly cooled.

Namely, when an image is erased by the image erasing method of irradiating the medium with a laser light having a specific wavelength, the cooling rate of the recording layer is faster than the cooling rate of the recording layer when an image is erased by the image erasing method of heating the surface of the thermoreversible recording medium. It is considered that the difference in the cooling rate causes the difference in occurrence of the background fog.

The inventors of the present invention have been diligently studied, and found a method for erasing an image, in which the image is uniformly erased, and the background fog on the thermoreversible recording medium caused by repetitive image erasure is reduced, as described below.

That is, the method for erasing an image of the present invention includes irradiating an image formed on a thermoreversible recording medium with a laser light having a wavelength of 700 nm to 1,500 nm so as to heat, thereby erasing the image (the image erasing step), wherein an energy density of the laser light is in a range of the energy density which can erase the image and a center value or less of the range of the energy density, wherein the thermoreversible recording medium includes a support, and a thermoreversible recording layer on the support, and wherein the thermoreversible recording layer contains a leuco dye serving as an electron-donating color-forming compound and a reversible developer serving as an electron-accepting compound, in which color tone reversibly changes by heat, and at least one of the thermoreversible recording layer and a layer adjacent to the thermoreversible recording layer contains a photothermal conversion material, which absorbs the light having a specific wavelength and converts the light into heat.

Here, a range of the energy density which can erase the image in the present invention means the range of the energy density at which a color density value of an image formation part of a thermoreversible recording medium becomes 0.02 or less of a color density value of the background of the thermoreversible recording medium when the image formed on the image formation part of the thermoreversible recording medium is irradiated with a laser light having such energy density.

The density value can be measured by a reflection densitometer.

The energy density of a laser light for irradiation in the image erasing step is respectively defined in the case where an image is erased by overlapping laser lights in the image erasing step, and in the case where an image is erased by a laser light without overlapping in the image erasing step.

In the case where an image is erased by overlapping laser lights in the image erasing step, an output of the laser light in the image erasing step is defined as P, a scanning linear velocity of the laser light in the image erasing step is defined as V, and an interval in vertical scanning direction of the laser lights in the image erasing step is defined as I, and the energy density is represented by the relationship: $P/(V*I)$.

On the other hand, in the case where an image is erased by a laser light without overlapping in the image erasing step, an output of the laser light in the image erasing step is defined as P, a scanning linear velocity of the laser light in the image erasing step is defined as V, and a spot diameter on the medium which is vertical with respect to the scanning direction of the laser light in the image erasing step is defined as r, and an energy density is represented by the relationship: $P/(V*r)$.

Examples of methods of changing the energy density in the image erasing step include, but not limited to, change of only "P", change of only "V", and change of only "I" or "r". These methods may be used alone or in combination.

In the present invention, as a method for changing the energy density of a laser light for irradiation so as to erase an image with an energy density of the laser light in a range of the energy density which can erase the image and of a center value or less of the range, a method of changing "P" or "V" is preferable.

In the case where the image formation part and/or a non image formation part is irradiated with a laser light in the image erasing step, when the energy density of the laser light is changed, the minimum energy density value which can erase the image in the image formation part is defined as the lower limit on energy density value in the range of the energy density value which can erase the image, and the maximum energy density value which can erase the image in the image formation part is defined as the upper limit on the energy density value in the range of the energy density value which can erase the image. Thus, a range of the energy density which can erase the image can be obtained from the lower limit on the energy density and the upper limit on the energy density.

Here, the center value in the range of the energy density which can erase the image is represented by an average value of the lower limit on the energy density and the upper limit on the energy density.

The lower limit value on the energy density of a laser light for irradiation used in the image erasing step is preferably 1 or more, and preferably 2 or more, and even more preferably 2.4 or more, provided that the minimum energy density value which can erase the image is 0, and the maximum energy density value which can erase the image is 10. The upper limit value of the energy density of a laser light for irradiation used in the image erasing step is preferably 4 or less, more preferably 3 or less, and even more preferably 2.6 or less, similarly provided that the minimum energy density value which can erase the image is 0, and the maximum energy density value which can erase the image is 10.

When the energy density of the laser light for irradiation is equal to or less than the lower limit on the energy density value, an image cannot be uniformly erased.

Moreover, provided that the minimum energy density value which can erase the image is 0 and the maximum energy density value which can erase the image is 10, when the energy density is adjusted to more than 5, the background fog severely occurs due to repetitive image erasure on the thermoreversible recording medium, and a clear contrast image is hard to be obtained.

Furthermore, provided that the minimum energy density value which can erase the image is 0 and the maximum energy density value which can erase the image is 10, when the energy density is adjusted to less than 1, the background fog due to repetitive image erasure on the thermoreversible recording medium decreases, but the difference in density increases between a residual image due to repetitive image formation and erasure and a background which has been repeatedly erased. Thus, the residual image stands out.

In the present invention, the background fog is obtained from a difference between a background density value and a background density value of a portion which is heated by applying a laser light having a specific wavelength, and then the background fog is evaluated depending on its value.

The background fog is preferably 0.04 or less, more preferably 0.03 or less, and even more preferably 0.02 or less. When the background fog is more than 0.04, a clear contrast image is hard to be obtained.

The output of the laser light for irradiation in the image erasing step, that is irradiating the thermoreversible recording medium with the laser light so as to heat, thereby erasing an image, may be suitably selected depending on the intended purpose without any restriction. It is preferably 5 W or greater, more preferably 7 W or greater, and even more preferably 10 W or greater.

When the output of the laser light is less than 5 W, it takes a long time to erase the image, and if an attempt is made to reduce the time spent on image erasure, image erasing failure occurs because of the insufficient output.

Additionally, the upper limit of the output of the laser light is suitably selected depending on the intended purpose without any restriction; it is preferably 200 W or less, more preferably 150 W or less, and even more preferably 100 W or less. When the output of the laser light is greater than 200 W, it leads to an increase in the size of a laser device.

The lower limit of the scanning velocity of the laser light for irradiation in the image erasing step, that is irradiating the thermoreversible recording medium with the laser light so as to heat, thereby erasing an image, is suitably selected depending on the intended purpose without any restriction; it is preferably 100 mm/s or greater, more preferably 200 mm/s or greater, and even more preferably 300 mm/s or greater. When the scanning velocity is less than 100 mm/s, it takes a long time to erase the image.

Additionally, the upper limit of the scanning velocity of the laser light is suitably selected depending on the intended purpose without any restriction; it is preferably 20,000 mm/s or less, more preferably 15,000 mm/s or less, and even more preferably 10,000 mm/s or less. When the scanning velocity is higher than 20,000 mm/s, it is difficult to erase a uniform image.

The lower limit of the spot diameter of the laser light for irradiation in the image erasing step, that is irradiating the thermoreversible recording medium with the laser light so as to heat, thereby erasing an image, is suitably selected depending on the intended purpose without any restriction; it is preferably 0.5 mm or greater, more preferably 1.0 mm or greater, and even more preferably 2.0 mm or greater.

Additionally, the upper limit of the spot diameter of the laser light is suitably selected depending on the intended purpose without any restriction; it is preferably 14.0 mm or less, more preferably 10.0 mm or less, and even more preferably 7.0 mm or less.

When the spot diameter of the laser light is smaller than the lower limit thereof, it takes a long time to erase the image. When the spot diameter of the laser light is larger than the upper limit thereof, image erasing failure occurs because of the insufficient output.

(Image Forming Step)

The image forming step is a step of heating the thermoreversible recording medium so as to form an image. A method for heating the thermoreversible recording medium is exemplified by known heating methods. Suppose that the thermoreversible recording medium is used in physical distribution lines, a method of heating the thermoreversible recording medium by applying a laser light is particularly preferable, because an image can be formed in a non-contact manner.

In the case where an image is formed on the thermoreversible recording medium by applying a laser light in the image forming step, an intensity distribution of the laser light particularly preferably satisfies the relationship of $0.40 \leqq I_1/I_2 \leqq 2.00$, because the background fog is hard to occur after image erasure.

$I_1$: a light intensity of the center portion of the laser light $I_2$: a light intensity of a 80% plane of the total irradiation energy of the laser light Here, the "80% plane of the total irradiation energy of the laser light" means a surface or a plane marked, for example, as shown in FIG. 1, when a light intensity of an emitted laser light is measured using a high-power beam analyzer using a high-sensitive pyroelectric camera, the obtained light intensity is three-dimensionally graphed, and the light intensity distribution is separated so that 80% of the total light energy sandwiched by a horizontal plane to a plane where Z is equal to zero and the plane where Z is equal to zero is contained therebetween.

For measuring a light intensity distribution of the laser light, a laser beam profiler using CCD etc. can be used when the laser light is emitted from, for example, a semiconductor laser, YAG laser or the like and has a wavelength in the near infrared region.

When the laser light is emitted from, for example, a $CO_2$ laser and has a wavelength in the far infrared region, the aforementioned CCD cannot be used, and thus a combination of a beam splitter and a power meter, or a high power beam analyzer using a high sensitive pyroelectric camera, or the like can be used.

Figure 2:
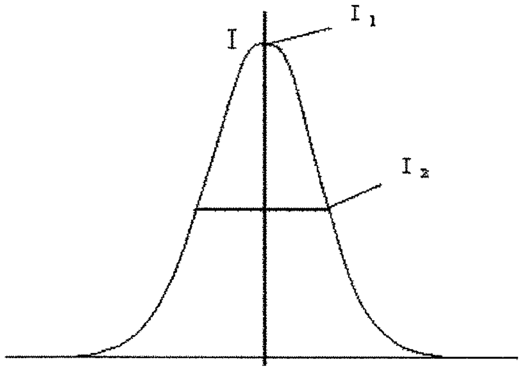
FIG. 2 is a schematic explanatory diagram showing the light intensity distribution (Gauss distribution) of normal laser light.

Examples of a light intensity distribution curve of a laser light in a cross section including the maximum value of the laser light when the intensity distribution of the laser light is changed are shown in FIGS. 2 to 5. FIG. 2 shows Gauss distribution, and in such an intensity distribution in which the center portion of the laser light is high in irradiation intensity, $I_2$ is low with respect to $I_1$, and thus the ratio $(I_1/I_2)$ is large.

Figure 3:
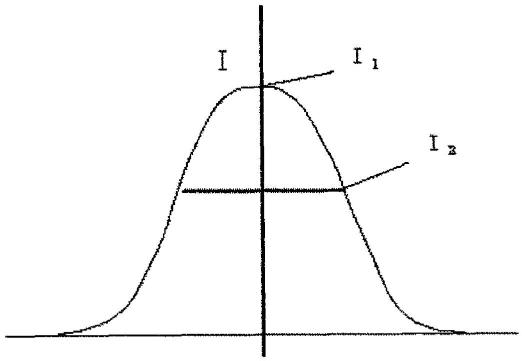
FIG. 3 is a schematic explanatory diagram showing one example of the light intensity distribution when the light intensity distribution of the laser light is changed.

Meanwhile, as shown in FIG. 3, in an intensity distribution in which the center portion of the laser light is lower in irradiation intensity than that in the intensity distribution of FIG. 2, $I_2$ is large with respect to and thus the ratio $(I_1/I_2)$ is lower than that in the intensity distribution of FIG. 2.

Figure 4:
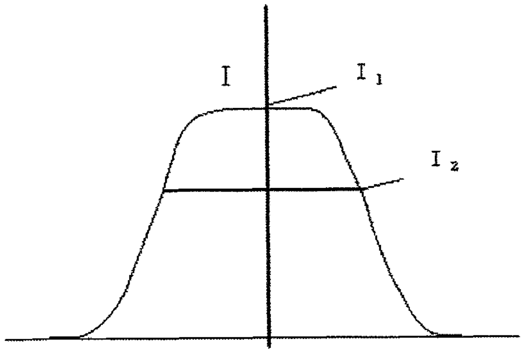
FIG. 4 is a schematic explanatory diagram showing one example of the light intensity distribution when the light intensity distribution of the laser light is changed.

In an intensity distribution having a form similar to that of a top hat, as shown in FIG. 4, $I_2$ further increases with respect to $I_1$, and thus the ratio $(I_1/I_2)$ is even lower than that in the intensity distribution of FIG. 3.

Figure 5:
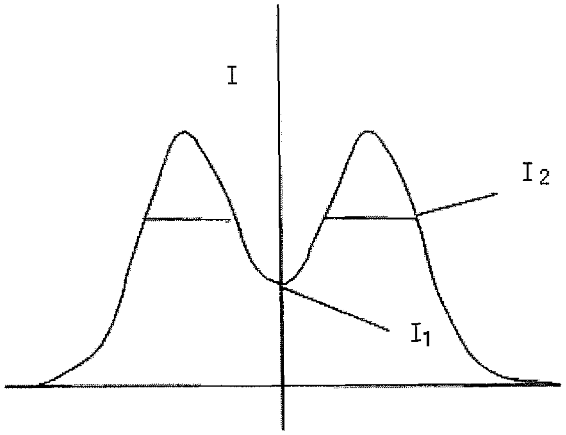
FIG. 5 is a schematic explanatory diagram showing one example of the light intensity distribution when the light intensity distribution of the laser light is changed.

In an intensity distribution in which the center portion of the laser light is low in irradiation intensity and the surrounding part is high in irradiation intensity, as shown in FIG. 5, $I_2$ still further increases with respect to $I_1$, and thus the ratio $(I_1/I_2)$ is even lower than that in the intensity distribution of FIG. 4. Accordingly, it can be said that the ratio $I_1/I_2$ represents the shape of the light intensity distribution of the laser light.

In the present invention, when the ratio $I_1/I_2$ is more than 2.00, the center portion of the light intensity becomes strong, excessive energy is applied to the thermoreversible recording medium, and as a result some of an image may be remained without being erased due to the deterioration of the thermoreversible recording medium after the repetitive image forming and erasing.

When the ratio $I_1/I_2$ is less than 0.40, energy is not applied to the center portion compared to the peripheric portion, and an image cannot be formed. When the irradiation energy to the center portion is increased so as to form an image, the light intensity of the peripheric portion becomes too high, excessive energy is applied to the thermoreversible recording medium, and the thermoreversible recording medium is deteriorated due to the repetitive image forming and erasing. In the present invention, the lower limit of the aforementioned ratio is preferably 0.40, more preferably 0.50, yet more preferably 0.60, yet even more preferably 0.70.

In the present invention, the upper limit of the aforementioned ratio is preferably 2.00, more preferably 1.90, yet more preferably 1.80, yet even more preferably 1.70.

Moreover, when the ratio $I_1/I_2$ is more than 1.59, the light intensity distribution becomes the one in which the center portion of the light intensity is higher than the surrounding portions of the light intensity, a thickness of a drawing line can be changed by adjusting the irradiation power without changing the irradiation distance at the same time as suppressing the deterioration of the thermoreversible recording medium due to the repetitive image forming and erasing.

A method for changing the light intensity distribution of the laser light from Gauss distribution to the one in which the light intensity $I_1$ of the center portion of the laser light and the light intensity $I_2$ at the 80% plane of the total irradiation energy of the laser light satisfy the relationship of $0.40 \leqq I_1/I_2 \leqq 2.00$ is suitably selected depending on the intended purpose without any restriction.

For example, the method using a light intensity adjusting unit is particularly preferable. The light intensity distribution adjusting unit is suitably selected depending on the intended purpose without any restriction. Suitable examples thereof include, but not limited to, lenses, filters, masks, mirrors and fiber couplings.

For example, the light intensity can be adjusted by shifting the distance between the thermoreversible recording medium and the fθ lens, which is a condenser lens, from the focal distance.

Figure 7A:
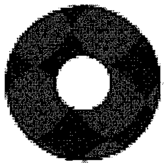
FIG. 7A is a diagram explaining one example of a mask.
Figure 7B:
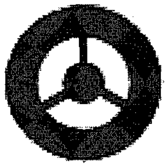
FIG. 7B is a diagram explaining another example of a mask.
Figure 7C:
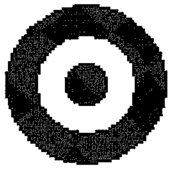
FIG. 7C is a diagram explaining still another example of a mask.

As the mask, masks having shapes shown in FIGS. 7A, 7B and 7C may be used.

Figure 8:
FIG. 8 is a diagram explaining one example of an aspheric lens element.

As the lens, an aspheric lens element is preferably used, and a shape of the aspheric lens element is, for example, preferably one as shown in FIG. 8.

The output of the laser light applied in the image forming step is suitably selected depending on the intended purpose without any restriction; however, it is preferably 1 W or greater, more preferably 3 W or greater, and even more preferably 5 W or greater. When the output of the laser light is less than 1 W, it takes a long time to form an image, and if an attempt is made to reduce the time spent on image forming, a high-density image cannot be obtained because of a lack of output. Additionally, the upper limit of the output of the laser light is suitably selected depending on the intended purpose without any restriction; it is preferably 200 W or less, more preferably 150 W or less, and even more preferably 100 W or less. When the output of the laser light is greater than 200 W, it leads to an increase in the size of a laser device.

The scanning velocity of the laser light applied in the image forming step is suitably selected depending on the intended purpose without any restriction; it is preferably 300 mm/s or greater, more preferably 500 mm/s or greater, and even more preferably 700 mm/s or greater. When the scanning velocity is less than 300 mm/s, it takes a long time to form an image. Additionally, the upper limit of the scanning velocity of the laser light is suitably selected depending on the intended purpose without any restriction; it is preferably 15,000 mm/s or less, more preferably 10,000 mm/s or less, and even more preferably 8,000 mm/s or less. When the scanning velocity is higher than 15,000 mm/s, it is difficult to form a uniform image.

The spot diameter of the laser light applied in the image forming step is suitably selected depending on the intended purpose without any restriction; it is preferably 0.02 mm or greater, more preferably 0.1 mm or greater, and even more preferably 0.15 mm or greater. Additionally, the upper limit of the spot diameter of the laser light is suitably selected depending on the intended purpose without any restriction; it is preferably 3.0 mm or less, more preferably 2.5 mm or less, and even more preferably 2.0 mm or less.

When the spot diameter is small, the line width of an image is also thin, and the contrast of the image lowers, thereby causing a decrease in visibility. When the spot diameter is large, the line width of an image is also thick, and adjacent lines overlap, thereby making it impossible to print small letters/characters.

(Image Erasing Device)

An image erasing device is used for the image erasing method of the present invention, and includes at least a laser light emitting unit configured to emit the laser light to the thermoreversible recording layer, and a light scanning unit which is arranged in a path of the laser light emitted from the laser light emitting unit so as to change the path and is configured to scan the thermoreversible recording layer with the laser light, and further includes other members suitably selected in accordance with the necessity. In the present invention, the thermoreversible recording medium at least contains a photothermal conversion material having a function to absorb a laser light with high efficiency and generate heat, which will be specifically explained below. Thus, the wavelength of the laser light to be emitted needs to be selected so that it is absorbed most effectively in the photothermal conversion material contained in the thermoreversible recording medium among the materials therein.

(Laser Light Emitting Unit)

A wavelength of a laser light emitted from a laser light emitting unit in the image erasing step is 700 nm to 1,500 nm, and may be appropriately selected from a wavelength range which is absorbed in the photothermal conversion material. It is preferably 720 nm or more, and more preferably 750 nm or more. The upper limit of the wavelength of the laser light may be suitably selected depending on the intended purpose, and it is preferably 1,300 mm or less, and more preferably 1,200 nm or less.

When the wavelength of the laser light is less than 700 nm, the contrast of an image formed on the thermoreversible recording medium may be lowered, and the thermoreversible recording medium may be colored in the visible light range. In the ultraviolet range in which a wavelength is shorter than the visible light range, the thermoreversible recording medium easily degrades.

The photothermal conversion material, which is added to the thermoreversible recording medium, needs a high decomposition temperature to secure durability against repetitive image processing. When an organic pigment is used as the photothermal conversion material, it is difficult to obtain the photothermal conversion material having a high decomposition temperature and long absorption wavelength. Therefore, a wavelength of a laser light is 1,500 nm or less.

The laser light emitting unit in the image erasing step may be suitably selected depending on the intended purpose. Examples thereof include YAG lasers, fiber lasers, and semiconductor lasers (LD). Of these, the semiconductor lasers are particularly preferably used, in terms that its wide selectivity of wavelength increases choices of the photothermal conversion material, and that a laser light source itself is small, thereby achieving downsizing of the device and price-reduction as a laser device.

When a laser light is used in the image forming step, the laser light emitting unit is suitably selected depending on the intended purpose without any restriction. Examples thereof include conventional lasers such as YAG lasers, fiber lasers, semiconductor lasers (LD), and $CO_2$ lasers.

A wavelength of the laser light emitted from the laser light emitting unit is suitably selected depending on the intended purpose without any restriction, but it is preferably in the range of from the visible region to the infrared region, more preferably in the range of from the near infrared region to the far infrared region because an image contrast is improved with the light having a wavelength within this range.

The wavelength of the laser light emitted from the YAG laser, fiber laser, and LD is in the visible to near infrared region (several hundred micrometers to 1.2 μm). The use of such lasers has an advantage such that a highly precise image can be formed because the wavelength of the laser light is short.

In addition, as the YAG laser and fiber laser have high output, there is an advantage such that image processing can be high speeded. The LD has an advantage such that the device can be downsized and reduced in price, as the laser itself is small.

The image erasing device of the present invention has the same basic structure as that of the one which is generally referred to as a laser marker, which includes at least an oscillator unit, a power supply controlling unit, and a program unit, except that the image erasing device of the present invention includes at least the laser light emitting unit and the light scanning unit. As the light scanning unit, a scanning unit 5 as shown in FIG. 6 is exemplified.

Moreover, the image erasing device is configured as an image processing device which includes an image forming section including the laser light emitting unit and the light scanning unit.

Figure 6:
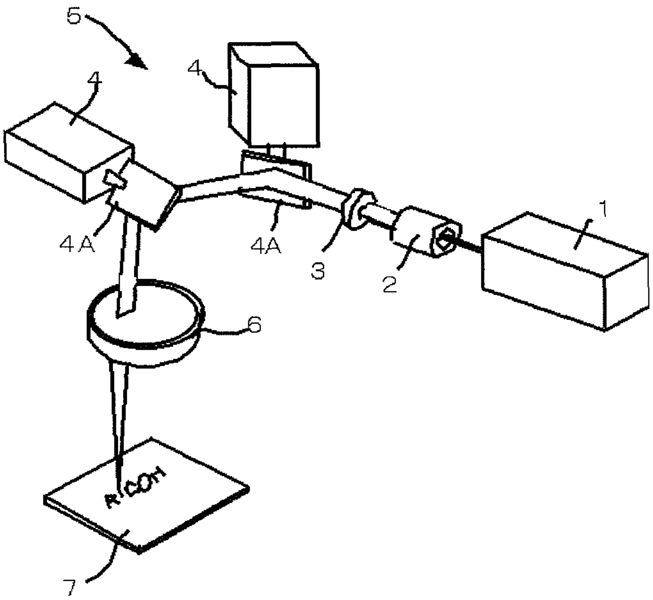
FIG. 6 is a diagram explaining one example of the image processing device of the present invention.

Here, one example of the image processing device of the present invention, mainly the laser light emitting unit, is shown in FIG. 6.

The oscillator unit contains a laser oscillator 1, a beam expander 2, a scanning unit 5, and the like.

The laser oscillator 1 is necessary for attaining a laser light having high intensity and high directivity. For example, a couple of mirrors are disposed at each side of a laser medium, the laser medium is pumped (supplied with energy), a number of atoms in the excited state is increased, a population inversion is formed to thereby induce emission. By selectively amplifying the light in the direction of the optical axis, the directivity of the light is increased, and the laser light is released from the output mirror.

The scanning unit 5 includes a galvanometer 4, and a galvanometer mirror 4A mounted to the galvanometer 4. The laser light output from the laser oscillator 1 is rotary scanned at high speed by two galvanometer mirrors 4A each mounted to the galvanometer 4 and disposed in the directions of X axis and Y axis, respectively, to thereby form or erase an image on a thermoreversible recording medium 7.

The power supply controlling unit includes a driving power supply of a light source configured to excite a laser medium, a driving power supply for the galvanometer, a power supply for cooling such as Peltier element, and a control unit for controlling the entire image processing device.

The program unit is a unit configured to input conditions such as an intensity, scanning velocity and the light of laser light, form and edit characters to be formed or the like for image forming or image erasing based on input from a touch-panel or keyboard.

The laser light emitting unit, namely a head part for image forming and erasing, is mounted to the image processing device, and the image processing device further includes a conveying unit for the thermoreversible recording medium, a controlling unit thereof, a monitor unit (a touch-panel) and the like.

The image processing method is capable of repeatedly forming and erasing a high contrast image on a thermoreversible recording medium, such as a label attached to a container such as a cardboard box or a plastic container, at high speed in a non-contact system. In addition, the image processing method is capable of inhibiting the background fog on the thermoreversible recording medium due to the repetitive image forming and erasing. For this reason, the image processing method is especially suitably used for distribution and delivery systems. In this case, an image can be formed on and erased from the label while transferring the cardboard box or plastic container placed on the conveyer belt, and thus the time required for shipping can be reduced as it is not necessary to stop the production line.

Moreover, the label attached to the cardboard box or plastic container can be reused in the same state, and image erasing and forming can be performed again without removing the label from the cardboard box or plastic container.

<Image Forming and Image Erasing Mechanism>

The image forming and image erasing mechanism includes an aspect in which color tone reversibly changes by heat. The aspect is such that a combination of a leuco dye and a reversible developer (hereinafter otherwise referred to as "developer") enables the color tone to reversibly change by heat between a transparent state and a colored state.

Figure 9:
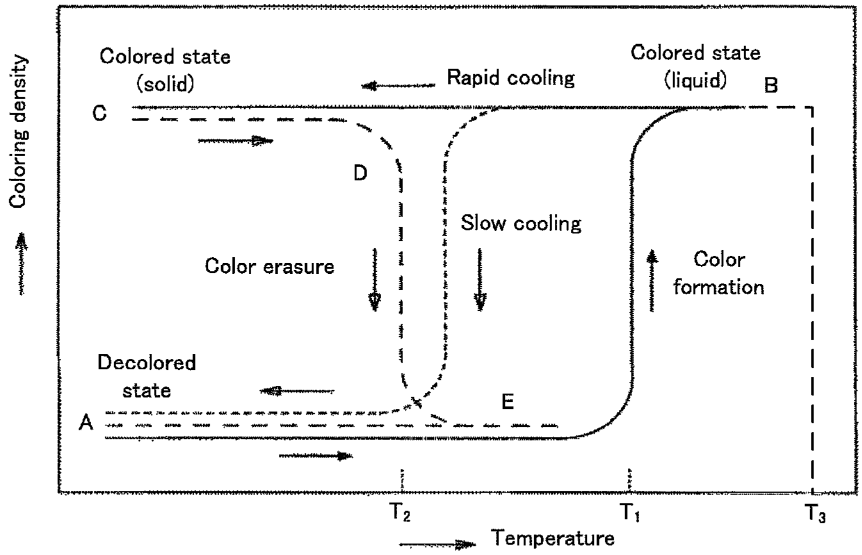
FIG. 9 is a graph showing the coloring and decoloring properties of a thermoreversible recording medium.
Figure 10:
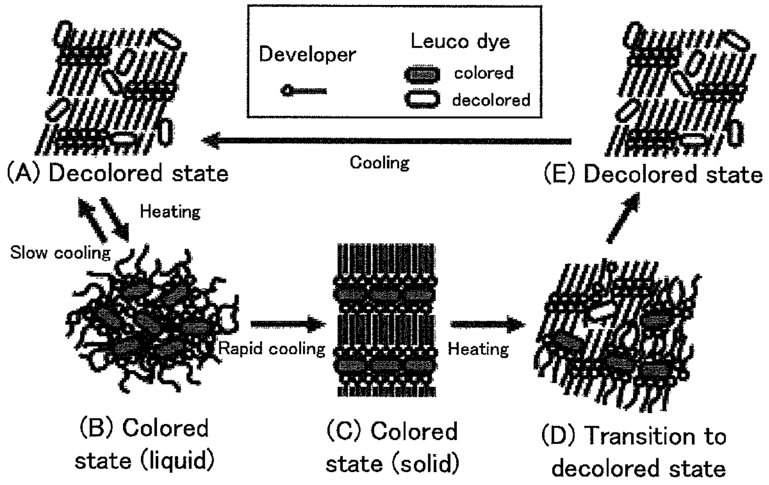
FIG. 10 is a schematic explanatory diagram showing a coloring and decoloring mechanism of the thermoreversible recording medium.

FIG. 9 shows an example of the temperature—coloring density change curve of a thermoreversible recording medium which has a thermoreversible recording layer formed of the resin containing the leuco dye and the developer. FIG. 10 shows the coloring and decoloring mechanism of the thermoreversible recording medium which reversibly changes by heat between a transparent state and a colored state.

First of all, when the recording layer in a decolored (colorless) state (A) is raised in temperature, the leuco dye and the developer melt and mix at the melting temperature $T_1$, thereby developing color, and the recording layer thusly comes into a melted and colored state (B). When the recording layer in the melted and colored state (B) is rapidly cooled, the recording layer can be lowered in temperature to room temperature, with its colored state kept, and it thusly comes into a colored state (C) where its colored state is stabilized and fixed. Whether or not this colored state is obtained depends upon the temperature decreasing rate from the temperature in the melted state: in the case of slow cooling, the color is erased in the temperature decreasing process, and the recording layer returns to the decolored state (A) it was in at the beginning, or comes into a state where the density is low in comparison with the density in the colored state (C) produced by rapid cooling. When the recording layer in the colored state (C) is raised in temperature again, the color is erased at the temperature $T_2$ lower than the coloring temperature (from D to E), and when the recording layer in this state is lowered in temperature, it returns to the decolored state (A) it was in at the beginning.

The colored state (C) obtained by rapidly cooling the recording layer in the melted state is a state where the leuco dye and the developer are mixed together such that their molecules can undergo contact reaction, which is often a solid state. This state is a state where a melted mixture (coloring mixture) of the leuco dye and the developer crystallizes, and thus color is maintained, and it is inferred that the color is stabilized by the formation of this structure.

Meanwhile, the decolored state (A) is a state where the leuco dye and the developer are phase-separated. It is inferred that this state is a state where molecules of at least one of the compounds gather to constitute a domain or crystallize, and thus a stabilized state where the leuco dye and the developer are separated from each other by the occurrence of the flocculation or the crystallization. In many cases, phase separation of the leuco dye and the developer is brought about, and the developer crystallizes in this manner, thereby enabling color erasure with greater completeness.

As to both the color erasure by slow cooling from the melted state and the color erasure by temperature increase from the colored state shown in FIG. 9, the aggregation structure changes at $T_2$, causing phase separation and crystallization of the developer.

Further, in FIG. 9, when the temperature of the recording layer is repeatedly raised to the temperature $T_3$ higher than or equal to the melting temperature $T_1$, there may be caused such an erasure failure that an image cannot be erased even if the recording layer is heated to an erasing temperature. It is inferred that this is because the developer thermally decomposes and thus hardly flocculates or crystallizes, which makes it difficult for the developer to separate from the leuco dye. Degradation of the thermoreversible recording medium caused by repetitive image processing can be reduced by decreasing the difference between the melting temperature $T_1$ and the temperature $T_3$ in FIG. 9 when the thermoreversible recording medium is heated.

(Thermoreversible Recording Medium)

The thermoreversible recording medium used in the image erasing method includes at least a support, a thermoreversible recording layer and a photothermal conversion layer, and further includes other layers suitably selected in accordance with the necessity, such as a protective layer, an intermediate layer, an undercoat layer, a back layer, an adhesion layer, a tackiness layer, a coloring layer, an air layer and a light-reflecting layer. Each of these layers may have a single-layer structure or a laminated structure.

(Support)

The shape, structure, size and the like of the support are suitably selected depending on the intended purpose without any restriction. Examples of the shape include plate-like shapes; the structure may be a single-layer structure or a laminated structure; and the size may be suitably selected according to the size of the thermoreversible recording medium, etc.

Examples of the material for the support include inorganic materials and organic materials.

Examples of the inorganic materials include glass, quartz, silicon, silicon oxide, aluminum oxide, $SiO_2$ and metals.

Examples of the organic materials include paper, cellulose derivatives such as cellulose triacetate, synthetic paper, and films made of polyethylene terephthalate, polycarbonates, polystyrene, polymethyl methacrylate, etc.

Each of the inorganic materials and the organic materials may be used alone or in combination. Among these materials, the organic materials are preferable, specifically films made of polyethylene terephthalate, polycarbonates, polymethyl methacrylate, etc. are preferable. Of these, polyethylene terephthalate is particularly preferable.

It is desirable that the support be subjected to surface modification by means of corona discharge, oxidation reaction (using chromic acid, for example), etching, facilitation of adhesion, antistatic treatment, etc. for the purpose of improving the adhesiveness of a coating layer.

Also, it is desirable to color the support white by adding, for example, a white pigment such as titanium oxide to the support.

The thickness of the support is suitably selected depending on the intended purpose without any restriction, with the range of 10 μm to 2,000 μm being preferable and the range of 50 μm to 1,000 μm being more preferable.

(Thermoreversible Recording Layer)

The thermoreversible recording layer (which may be hereinafter referred to simply as “recording layer”) includes a leuco dye serving as an electron-donating color-forming compound and a developer serving as an electron-accepting compound, in which color tone reversibly changes by heat, and further includes other components in accordance with the necessity.

The leuco dye serving as an electron-donating color-forming compound and reversible developer serving as an electron-accepting compound, in which color tone reversibly changes by heat are materials capable of exhibiting a phenomenon in which visible changes are reversibly produced by temperature change; and the material can relatively change into a colored state and into a decolored state, depending upon the heating temperature and the cooling rate after heating.

The materials in which color tone reversibly changes by heat include the leuco dye and reversible developer. The leuco dye is a dye precursor which is colorless or pale per se. The leuco dye is suitably selected from known leuco dyes without any restriction. Examples thereof include leuco compounds based upon triphenylmethane phthalide, triallylmethane, fluoran, phenothiazine, thiofluoran, xanthene, indophthalyl, spiropyran, azaphthalide, chromenopyrazole, methines, rhodamineanilinolactam, rhodaminelactam, quinazoline, diazaxanthene and bislactone. Among these, leuco dyes based upon fluoran and phthalide are particularly preferable in that they are excellent in coloring and decoloring property, colorfulness and storage ability. Each of these may be used alone or in combination, and the thermoreversible recording medium can be made suitable for multicolor or full-color recording by providing a layer which color forms with a different color tone.

The reversible developer is suitably selected depending on the intended purpose without any restriction, provided that it is capable of reversibly developing and erasing color by means of heat. Suitable examples thereof include a compound having in its molecules at least one of the following structures: a structure (1) having such a color-developing ability as makes the leuco dye develop color (for example, a phenolic hydroxyl group, a carboxylic acid group, a phosphoric acid group, etc.); and a structure (2) which controls cohesion among molecules (for example, a structure in which long-chain hydrocarbon groups are linked together).

In the bonded site, the long-chain hydrocarbon group may be bonded via a divalent or higher bond group containing a hetero atom. Additionally, the long-chain hydrocarbon groups may contain at least either similar linking groups or aromatic groups.

For the structure (1) having such a color-developing ability as makes the leuco dye develop color, phenol is particularly suitable.

For the structure (2) which controls cohesion among molecules, long-chain hydrocarbon groups having 8 or more carbon atoms, preferably 11 or more carbon atoms, are suitable, and the upper limit of the number of carbon atoms is preferably 40 or less, more preferably 30 or less.

Of the reversible developers, a phenol compound expressed by General Formula (1) is preferable, and a phenol compound expressed by General Formula (2) is more preferable.

General Formula (1)

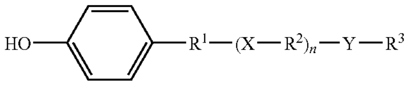

General Formula (2)

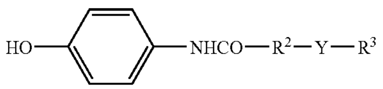

In General Formulae (1) and (2), $R^1$ denotes a single bond or an aliphatic hydrocarbon group having 1 to 24 carbon atoms. $R^2$ denotes an aliphatic hydrocarbon group having two or more carbon atoms, which may have a substituent, and the number of the carbon atoms is preferably 5 or greater, more preferably 10 or greater. $R^3$ denotes an aliphatic hydrocarbon group having 1 to 35 carbon atoms, and the number of the carbon atoms is preferably 6 to 35, more preferably 8 to 35. Each of these aliphatic hydrocarbon groups may be provided alone or in combination.

The sum of the numbers of carbon atoms which $R^1$, $R^2$ and $R^3$ have is suitably selected depending on the intended purpose without any restriction, with its lower limit being preferably 8 or greater, more preferably 11 or greater, and its upper limit being preferably 40 or less, more preferably 35 or less.

When the sum of the numbers of carbon atoms is less than 8, coloring stability or decoloring ability may degrade.

Each of the aliphatic hydrocarbon groups may be a straight-chain group or a branched-chain group and may have an unsaturated bond, with preference being given to a straight-chain group. Examples of the substituent bonded to the aliphatic hydrocarbon group include a hydroxyl group, halogen atoms and alkoxy groups.

X and Y may be identical or different, each denoting an N atom-containing or O atom-containing divalent group. Specific examples thereof include an oxygen atom, amide group, urea group, diacylhydrazine group, diamide oxalate group and acylurea group, with amide group and urea group being preferable.

"n" denotes an integer of 0 to 1.

It is desirable that the electron-accepting compound (developer) be used together with a compound as a color erasure accelerator having in its molecules at least one of —NHCO— group and —OCONH— group because intermolecular interaction is induced between the color erasure accelerator and the developer in a process of producing a decolored state and thus there is an improvement in coloring and decoloring property.

The color erasure accelerator is suitably selected depending on the intended purpose without any restriction.

For the thermoreversible recording layer, a binder resin and, if necessary, additives for improving or controlling the coating properties and coloring and decoloring properties of the recording layer may be used. Examples of these additives include a surfactant, a conductive agent, a filling agent, an antioxidant, a light stabilizer, a coloring stabilizer and a color erasure accelerator.

The binder resin is suitably selected depending on the intended purpose without any restriction, provided that it enables the recording layer to be bonded onto the support. For instance, one of conventionally known resins or a combination of two or more thereof may be used for the binder resin. Among these resins, resins capable of being cured by heat, an ultraviolet ray, an electron beam or the like are preferable in that the durability at the time of repeated use can be improved, with particular preference being given to thermosetting resins each containing an isocyanate compound or the like as a cross-linking agent. Examples of the thermosetting resins include a resin having a group which reacts with a cross-linking agent, such as a hydroxyl group or carboxyl group, and a resin produced by copolymerizing a hydroxyl group-containing or carboxyl group-containing monomer and other monomer. Specific examples of such thermosetting resins include phenoxy resins, polyvinyl butyral resins, cellulose acetate propionate resins, cellulose acetate butyrate resins, acrylpolyol resins, polyester polyol resins and polyurethane polyol resins, with particular preference being given to acrylpolyol resins, polyester polyol resins and polyurethane polyol resins.

The mixture ratio (mass ratio) of the color former to the binder resin in the recording layer is preferably in the range of 1:0.1 to 1:10. When the amount of the binder resin is too small, the recording layer may be deficient in thermal strength. When the amount of the binder resin is too large, it is problematic because the coloring density decreases.

The cross-linking agent is suitably selected depending on the intended purpose without any restriction, and examples thereof include isocyanates, amino resins, phenol resins, amines and epoxy compounds. Among these, isocyanates are preferable, and polyisocyanate compounds each having a plurality of isocyanate groups are particularly preferable.

As to the amount of the cross-linking agent added in relation to the amount of the binder resin, the ratio of the number of functional groups contained in the cross-linking agent to the number of active groups contained in the binder resin is preferably in the range of 0.01:1 to 2:1. When the amount of the cross-linking agent added is so small as to be outside this range, sufficient thermal strength cannot be obtained. When the amount of the cross-linking agent added is so large as to be outside this range, there is an adverse effect on the coloring and decoloring properties.

Further, as a cross-linking promoter, a catalyst utilized in this kind of reaction may be used.

The gel fraction of any of the thermosetting resins in the case where thermally cross-linked is preferably 30% or greater, more preferably 50% or greater, even more preferably 70% or greater. When the gel fraction is less than 30%, an adequate cross-linked state cannot be produced, and thus there may be degradation of durability.

As to a method for distinguishing between a cross-linked state and a non-cross-linked state of the binder resin, these two states can be distinguished by immersing a coating film in a solvent having high dissolving ability, for example.

Specifically, with respect to the binder resin in a non-cross-linked state, the resin dissolves in the solvent and thus does not remain in a solute.

The above-mentioned other components in the recording layer are suitably selected depending on the intended purpose without any restriction. For instance, a surfactant, a plasticizer and the like are suitable therefor in that recording of an image can be facilitated.

To a solvent, a coating solution dispersing device, a recording layer applying method, a drying and hardening method and the like used for the recording layer coating solution, those that are known used in a back layer, which will be explained later, can be applied.

To prepare the recording layer coating solution, materials may be together dispersed into a solvent using the dispersing device; alternatively, the materials may be independently dispersed into respective solvents and then the solutions may be mixed together. Further, the ingredients may be heated and dissolved, and then they may be precipitated by rapid cooling or slow cooling.

The method for forming the recording layer is suitably selected depending on the intended purpose without any restriction. Suitable examples thereof include a method (1) of applying onto a support a recording layer coating solution in which the resin, the electron-donating color-forming compound and the electron-accepting compound are dissolved or dispersed in a solvent, then cross-linking the coating solution while or after forming it into a sheet or the like by evaporation of the solvent; a method (2) of applying onto a support a recording layer coating solution in which the electron-donating color-forming compound and the electron-accepting compound are dispersed in a solvent in which only the resin is dissolved, then cross-linking the coating solution while or after forming it into a sheet or the like by evaporation of the solvent; and a method (3) of not using a solvent and heating and melting the resin, the electron-donating color-forming compound and the electron-accepting compound so as to mix, then cross-linking this melted mixture after forming it into a sheet or the like and cooling it. In each of these methods, it is also possible to produce the recording layer as a thermoreversible recording medium in the form of a sheet without using the support.

The solvent used in (1) or (2) cannot be unequivocally defined, as it is affected by the types, etc. of the resin, the electron-donating color-forming compound and the electron-accepting compound. Examples thereof include tetrahydrofuran, methyl ethyl ketone, methyl isobutyl ketone, chloroform, carbon tetrachloride, ethanol, toluene and benzene.

Additionally, the electron-accepting compound is present in the recording layer, being dispersed in the form of particles.

A pigment, an antifoaming agent, a dispersant, a slip agent, an antiseptic agent, a cross-linking agent, a plasticizer and the like may be added into the recording layer coating solution, for the purpose of exhibiting high performance as a coating material.

The coating method for the recording layer is suitably selected depending on the intended purpose without any restriction. For instance, a support which is continuous in the form of a roll or which has been cut into the form of a sheet is conveyed, and the support is coated with the recording layer by a known method such as blade coating, wire bar coating, spray coating, air knife coating, bead coating, curtain coating, gravure coating, kiss coating, reverse roll coating, dip coating or die coating.

The drying conditions of the recording layer coating solution are suitably selected depending on the intended purpose without any restriction. For instance, the recording layer coating solution is dried at room temperature to a temperature of 140° C., for approximately 10 sec to 10 min.

The thickness of the recording layer is suitably selected depending on the intended purpose without any restriction. For instance, it is preferably 1 μm to 20 μm, more preferably 3 μm to 15 μm. When the recording layer is too thin, the contrast of an image may lower because the coloring density lowers. When the recording layer is too thick, the heat distribution in the layer increases, a portion which does not reach a coloring temperature and so does not form color is created, and thus a desired coloring density may be unable to be obtained.

(Photothermal Conversion Layer)

The photothermal conversion layer contains at least a photothermal conversion material having a function to absorb a laser light and generate heat.

The photothermal conversion material is preferably contained in at least one of the thermoreversible recording layer and a layer adjacent to the thermoreversible recording layer.

When the photothermal conversion material is contained in the recording layer, the recording layer also serves as the photothermal conversion layer. The photothermal conversion layer being adjacent to the thermoreversible recording layer means the state where the photothermal conversion layer is in contact with the thermoreversible recording layer, or the state where a layer having a thickness equal to or thinner than that of the recording layer is formed between the thermoreversible recording layer and the photothermal conversion layer. A barrier layer may be formed between the thermoreversible recording layer and the photothermal conversion layer for the purpose of inhibiting an interaction therebetween. The barrier layer is preferably formed by using a material having high thermal conductivity. The layer deposited between the thermoreversible recording layer and the photothermal conversion layer is suitably selected depending on the intended purpose without any restriction.

The photothermal conversion material is broadly classified into inorganic materials and organic materials. Examples of the inorganic materials include carbon black, metals such as Ge, Bi, In, Te, Se, and Cr, or semi-metals thereof and alloys thereof.

Each of these inorganic materials is formed into a layer form by vacuum evaporation method or by bonding a particulate material using a resin or the like.

For the organic material, various dyes can be suitably used in accordance with the wavelength of light to be absorbed, however, when a laser diode is used as a light source, a near-infrared absorption pigment having an absorption peak near wavelengths of 700 nm to 1,500 nm is used. Specific examples thereof include cyanine pigments, quinone, quinoline derivatives of indonaphthol, phenylene diamine nickel complexes, and phthalocyanine pigments. To perform repetitive image processing, it is preferable to select a photothermal conversion material that is excellent in heat resistance, with particular preference being given to phthalocyanine pigments.

Each of the near-infrared absorption pigments may be used alone or in combination.

When the photothermal conversion layer is formed, the photothermal conversion material is typically used in combination with a resin. The resin used in the photothermal conversion layer is suitably selected from among those known in the art without any restriction, as long as it can maintain the inorganic material and the organic material therein, with preference being given to a thermoplastic resin and a thermosetting resin.

The thermoreversible recording medium includes at least the support, the reversible thermosensitive recording layer, and further includes other layers suitably selected in accordance with the necessity, such as an intermediate layer, an undercoat layer, a coloring layer, an air layer, a light-reflecting layer, an adhesion layer, a back layer, a protective layer, adhesive layer, and a tackiness layer. Each of these layers may have a single-layer structure or a laminated structure.

A layer deposited on the layer containing the photothermal conversion material is preferably formed by using a material which absorbs a less amount of a light having a specific wavelength in order to reduce energy loss of the laser light to be applied.

(Protective Layer)

In the thermoreversible recording medium, it is desirable that a protective layer be provided on the recording layer, for the purpose of protecting the recording layer. The protective layer is suitably selected depending on the intended purpose without any restriction. For instance, the protective layer may be formed from one or more layers, and it is preferably provided on the outermost surface that is exposed.

The protective layer contains a binder resin and further contains other components such as a filler, a lubricant and a coloring pigment in accordance with the necessity.

The resin in the protective layer is suitably selected depending on the intended purpose without any restriction. For instance, the resin is preferably a thermosetting resin, an ultraviolet (UV) curable resin, an electron beam curable resin, etc., with particular preference being given to an ultraviolet (UV) curable resin and a thermosetting resin.

The UV-curable resin can form a very hard film after cured, and reducing damage done by physical contact of the surface and deformation of the medium caused by laser heating; therefore, it is possible to obtain a thermoreversible recording medium superior in durability against repeated use.

Although slightly inferior to the UV-curable resin, the thermosetting resin makes it possible to harden the surface as well and is superior in durability against repeated use.

The UV-curable resin is suitably selected from known UV-curable resins depending on the intended purpose without any restriction.

Examples thereof include oligomers based upon urethane acrylates, epoxy acrylates, polyester acrylates, polyether acrylates, vinyls and unsaturated polyesters; and monomers such as monofunctional and multifunctional acrylates, methacrylates, vinyl esters, ethylene derivatives and allyl compounds. Of these, multifunctional, i.e. tetrafunctional or higher, monomers and oligomers are particularly preferable. By mixing two or more of these monomers or oligomers, it is possible to suitably adjust the hardness, degree of contraction, flexibility, coating strength, etc. of the resin film.

To cure the monomers and the oligomers with an ultraviolet ray, it is necessary to use a photopolymerization initiator or a photopolymerization accelerator.

The amount of the photopolymerization initiator or the photopolymerization accelerator added is preferably 0.1% by mass to 20% by mass, more preferably 1% by mass to 10% by mass, in relation to the total mass of the resin component of the protective layer.

Ultraviolet irradiation for curing the ultraviolet curable resin can be conducted using a known ultraviolet irradiator, and examples of the ultraviolet irradiator include one equipped with a light source, a lamp fitting, a power source, a cooling device, a conveyance device, etc.

Examples of the light source include a mercury-vapor lamp, a metal halide lamp, a potassium lamp, a mercury-xenon lamp and a flash lamp. The wavelength of the light source may be suitably selected according to the ultraviolet absorption wavelength of the photopolymerization initiator and the photopolymerization accelerator added to the thermoreversible recording medium composition.

The conditions of the ultraviolet irradiation are suitably selected depending on the intended purpose without any restriction. For instance, it is advisable to decide the lamp output, the conveyance speed, etc. according to the irradiation energy necessary to cross-link the resin.

In order to improve the conveyance capability, a releasing agent such as a silicone having a polymerizable group, a silicone-grafted polymer, wax or zinc stearate; or a lubricant such as silicone oil may be added. The amount of any of these added is preferably 0.01% by mass to 50% by mass, more preferably 0.1% by mass to 40% by mass, in relation to the total mass of the resin component of the protective layer. Each of these may be used alone or in combination. Additionally, in order to prevent static electricity, a conductive filler is preferably used, more preferably a needle-like conductive filler.

The particle diameter of the filler is preferably 0.01 μm to 10.0 μm, more preferably 0.05 μm to 8.0 μm. The amount of the filler added is preferably 0.001 parts by mass to 2 parts by mass, more preferably 0.005 parts by mass to 1 part by mass, in relation to 1 part by mass of the resin.

Further, a surfactant, a leveling agent, an antistatic agent and the like that are conventionally known may be contained in the protective layer as additives.

Also, as the thermosetting resin, a resin similar to the binder resin used for the recording layer can be suitably used, for instance.

A polymer having an ultraviolet absorbing structure (hereinafter otherwise referred to as "ultraviolet absorbing polymer") may also be used.

Here, the polymer having an ultraviolet absorbing structure denotes a polymer having an ultraviolet absorbing structure (e.g. ultraviolet absorbing group) in its molecules. Examples of the ultraviolet absorbing structure include salicylate structure, cyanoacrylate structure, benzotriazole structure and benzophenone structure. Of these, benzotriazole structure and benzophenone structure are particularly preferable for their superior light resistance.

It is desirable that the thermosetting resin be cross-linked. Accordingly, the thermosetting resin is preferably a resin having a group which reacts with a curing agent, such as hydroxyl group, amino group or carboxyl group, particularly preferably a hydroxyl group-containing polymer. To increase the strength of a layer which contains the polymer having an ultraviolet absorbing structure, use of the polymer having a hydroxyl value of 10 mgKOH/g or greater is preferable because adequate coating strength can be obtained, more preferably use of the polymer having a hydroxyl value of 30 mgKOH/g or greater, even more preferably use of the polymer having a hydroxyl value of 40 mgKOH/g or greater. By making the protective layer have adequate coating strength, it is possible to reduce degradation of the recording medium even when erasure and printing are repeatedly carried out.

As the curing agent, a curing agent similar to the one used for the recording layer can be suitably used.

To a solvent, a coating solution dispersing device, a protective layer applying method, a drying method and the like used for the protective layer coating solution, those that are known and used for the recording layer can be applied. When an ultraviolet curable resin is used, a curing step by means of the ultraviolet irradiation with which coating and drying have been carried out is required, in which case an ultraviolet irradiator, a light source and the irradiation conditions are as described above.

The thickness of the protective layer is preferably 0.1 μm to 20 μm, more preferably 0.5 μm to 10 μm, even more preferably 1.5 μm to 6 μm. When the thickness is less than 0.1 μm, the protective layer cannot fully perform the function as a protective layer of the thermoreversible recording medium, the thermoreversible recording medium easily degrades through repeated use with heat, and thus it may become unable to be repeatedly used. When the thickness is greater than 20 μm, it is impossible to pass adequate heat to a thermosensitive section situated under the protective layer, and thus printing and erasure of an image by heat may become unable to be sufficiently performed.

(Intermediate Layer)

In the present invention, it is desirable to provide an intermediate layer between the recording layer and the protective layer, for the purpose of improving adhesiveness between the recording layer and the protective layer, preventing change in the quality of the recording layer caused by application of the protective layer, and preventing the additives in the protective layer from transferring to the recording layer. This makes it possible to improve the ability to store a colored image.

The intermediate layer contains at least a binder resin and further contains other components such as a filler, a lubricant and a coloring pigment in accordance with the necessity.

The binder resin is suitably selected depending on the intended purpose without any restriction. For the binder resin, the binder resin used for the recording layer or a resin component such as a thermoplastic resin or thermosetting resin may be used. Examples of the resin component include polyethylene, polypropylene, polystyrene, polyvinyl alcohol, polyvinyl butyral, polyurethane, saturated polyesters, unsaturated polyesters, epoxy resins, phenol resins, polycarbonates and polyamides.

It is desirable that the intermediate layer contain an ultraviolet absorber. For the ultraviolet absorber, any one of an organic compound and an inorganic compound may be used.

Also, an ultraviolet absorbing polymer may be used, and this may be cured by means of a cross-linking agent. As these compounds, compounds similar to those used for the protective layer can be suitably used.

The thickness of the intermediate layer is preferably 0.1 μm to 20 μm, more preferably 0.5 μm to 5 μm. To a solvent, a coating solution dispersing device, an intermediate layer applying method, an intermediate layer drying and hardening method and the like used for the intermediate layer coating solution, those that are known and used for the recording layer can be applied.

(Under Layer)

In the present invention, an under layer may be provided between the recording layer and the support, for the purpose of effectively utilizing applied heat for high sensitivity, or improving adhesiveness between the support and the recording layer, and preventing permeation of recording layer materials into the support.

The under layer contains at least hollow particles, also contains a binder resin and further contains other components in accordance with the necessity.

Examples of the hollow particles include single hollow particles in which only one hollow portion is present in each particle, and multi hollow particles in which numerous hollow portions are present in each particle. These types of hollow particles may be used independently or in combination.

The material for the hollow particles is suitably selected depending on the intended purpose without any restriction, and suitable examples thereof include thermoplastic resins. For the hollow particles, suitably produced hollow particles may be used, or a commercially available product may be used. Examples of the commercially available product include MICROSPHERE R-300 (manufactured by Matsumoto Yushi-Seiyaku Co., Ltd.); ROPAQUE HP1055 and ROPAQUE HP433J (both of which are manufactured by Zeon Corporation); and SX866 (manufactured by JSR Corporation).

The amount of the hollow particles added to the under layer is suitably selected depending on the intended purpose without any restriction, and it is preferably 10% by mass to 80% by mass, for instance.

For the binder resin, a resin similar to the resin used for the recording layer or used for the layer which contains the polymer having an ultraviolet absorbing structure can be used.

The under layer may contain at least one of an organic filler and an inorganic filler such as calcium carbonate, magnesium carbonate, titanium oxide, silicon oxide, aluminum hydroxide, kaolin or talc.

Besides, the under layer may contain a lubricant, a surfactant, a dispersant and so forth.

The thickness of the under layer is suitably selected depending on the intended purpose without any restriction, with the range of 0.1 μm to 50 μm being preferable, the range of 2 μm to 30 μm being more preferable, and the range of 12 μm to 24 μm being even more preferable.

(Back Layer)

In the present invention, for the purpose of preventing curl and static charge on the thermoreversible recording medium and improving the conveyance capability, a back layer may be provided on the surface of the support opposite to the surface where the recording layer is formed.

The back layer contains at least a binder resin and further contains other components such as a filler, a conductive filler, a lubricant and a coloring pigment in accordance with the necessity.

The binder resin is suitably selected depending on the intended purpose without any restriction. For instance, the binder resin is any one of a thermosetting resin, an ultraviolet (UV) curable resin, an electron beam curable resin, etc., with particular preference being given to an ultraviolet (UV) curable resin and a thermosetting resin.

For the ultraviolet curable resin, the thermosetting resin, the filler, the conductive filler and the lubricant, ones similar to those used for the recording layer, the protective layer or the intermediate layer can be suitably used.

(Adhesive Layer or Tackiness Layer)

In the present invention, the thermoreversible recording medium can be produced as a thermoreversible recording label by providing an adhesive layer or a tackiness layer on the surface of the support opposite to the surface where the recording layer is formed. The material for the adhesive layer or the tackiness layer can be selected from commonly used materials.

The material for the adhesive layer or the tackiness layer is suitably selected depending on the intended purpose without any restriction. Examples thereof include urea resins, melamine resins, phenol resins, epoxy resins, vinyl acetate resins, vinyl acetate-acrylic copolymers, ethylene-vinyl acetate copolymers, acrylic resins, polyvinyl ether resins, vinyl chloride-vinyl acetate copolymers, polystyrene resins, polyester resins, polyurethane resins, polyamide resins, chlorinated polyolefin resins, polyvinyl butyral resins, acrylic acid ester copolymers, methacrylic acid ester copolymers, natural rubbers, cyanoacrylate resins and silicone resins.

The material for the adhesive layer or the tackiness layer may be of a hot-melt type. Release paper may or may not be used. By thusly providing the adhesive layer or the tackiness layer, the thermoreversible recording label can be affixed to a whole surface or a part of a thick substrate such as a magnetic stripe-attached vinyl chloride card, which is difficult to coat with a recording layer. This makes it possible to improve the convenience of this medium, for example to display part of information stored in a magnetic recorder. The thermoreversible recording label provided with such an adhesive layer or tackiness layer can also be used on thick cards such as IC cards and optical cards.

In the thermoreversible recording medium, a coloring layer may be provided between the support and the recording layer, for the purpose of improving visibility. The coloring layer can be formed by applying a dispersion solution or a solution containing a colorant and a resin binder over a target surface and drying the dispersion solution or the solution; alternatively, the coloring layer can be formed by simply bonding a coloring sheet to the target surface.

The thermoreversible recording medium may be provided with a color printing layer. A colorant in the color printing layer is, for example, selected from dyes, pigments and the like contained in color inks used for conventional full-color printing. Examples of the resin binder include thermoplastic resins, thermosetting resins, ultraviolet curable resins and electron beam curable resins. The thickness of the color printing layer may be suitably selected according to the desired printed color density.

In the thermoreversible recording medium, an irreversible recording layer may be additionally used. In this case, the colored color tones of the recording layers may be identical or different. Also, a coloring layer which has been printed in accordance with offset printing, gravure printing, etc. or which has been printed with any pictorial design or the like using an inkjet printer, a thermal transfer printer, a sublimation printer, etc., for example, may be provided on the whole or a part of the same surface of the thermoreversible recording medium of the present invention as the surface where the recording layer is formed, or may be provided on a part of the opposite surface thereof. Further, an OP varnish layer composed mainly of a curable resin may be provided on a part or the whole surface of the coloring layer. Examples of the pictorial design include letters/characters, patterns, diagrams, photographs, and information detected with an infrared ray. Also, any of the layers that are simply formed may be colored by addition of dye or pigment.

Further, the thermoreversible recording medium of the present invention may be provided with a hologram for security. Also, to give variety in design, it may also be provided with a design such as a portrait, a company emblem or a symbol by forming depressions and protrusions in relief or in intaglio.

The thermoreversible recording medium may be formed into a desired shape according to its use, for example into a card, a tag, a label, a sheet or a roll. The thermoreversible recording medium in the form of a card can be used for prepaid cards, discount cards, i.e. so-called point cards, credit cards and the like. The thermoreversible recording medium in the form of a tag that is smaller in size than the card can be used for price tags and the like. The thermoreversible recording medium in the form of a tag that is larger in size than the card can be used for tickets, sheets of instruction for process control and shipping, and the like. The thermoreversible recording medium in the form of a label can be affixed; accordingly, it can be formed into a variety of sizes and, for example, used for process control and product control, being affixed to carts, receptacles, boxes, containers, etc. to be repeatedly used. The thermoreversible recording medium in the form of a sheet that is larger in size than the card offers a larger area for image formation, and thus it can be used for general documents and sheets of instruction for process control, for example.

(Example of Combination of Thermoreversible Recording Member and RF-ID)

A thermoreversible recording member used in the present invention is superior in convenience because the recording layer capable of reversible display, and an information storage section are provided on the same card or tag (so as to form a single unit), and part of information stored in the information storage section is displayed on the recording layer, thereby making it is possible to confirm the information by simply looking at a card or a tag without needing a special device. Also, when information stored in the information storage section is rewritten, rewriting of information displayed by the thermoreversible recording member makes it possible to use the thermoreversible recording medium repeatedly as many times as desired.

The information storage section is suitably selected depending on the intended purpose without any restriction, and suitable examples thereof include a magnetic recording layer, a magnetic stripe, an IC memory, an optical memory and an RF-ID tag. In the case where the information storage section is used for process control, product control, etc., an RF-ID tag is particularly preferable. The RF-ID tag is composed of an IC chip, and an antenna connected to the IC chip.

The thermoreversible recording member includes the recording layer capable of reversible display, and the information storage section. Suitable examples of the information storage section include an RF-ID tag.

Figure 11:
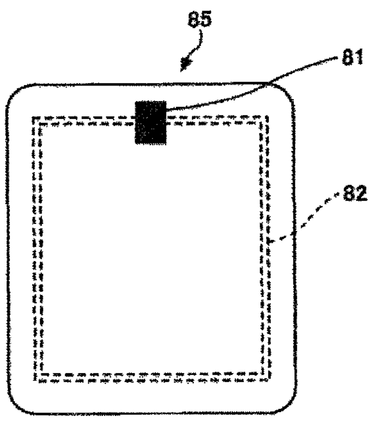
FIG. 11 is a schematic diagram showing one example of a RF-ID tag.

Here, FIG. 11 shows a schematic diagram of an example of an RF-ID tag 85. This RF-ID tag 85 is composed of an IC chip 81, and an antenna 82 connected to the IC chip 81. The IC chip 81 is divided into four sections, i.e. a storage section, a power adjusting section, a transmitting section and a receiving section, and communication is conducted as they perform their operations allotted. As for the communication, the RF-ID tag communicates with an antenna of a reader/writer by means of a radio wave so as to transfer data. Specifically, there are such two methods as follows: an electromagnetic induction method in which the antenna of the RF-ID tag receives a radio wave from the reader/writer, and electromotive force is generated by electromagnetic induction caused by resonance; and a radio wave method in which electromotive force is generated by a radiated electromagnetic field. In both methods, the IC chip inside the RF-ID tag is activated by an electromagnetic field from outside, information inside the chip is converted to a signal, then the signal is emitted from the RF-ID tag. This information is received by the antenna on the reader/writer side and recognized by a data processing unit, then data processing is carried out on the software side.

The RF-ID tag is formed into a label shape or a card shape and can be affixed to the thermoreversible recording medium. The RF-ID tag may be affixed to the recording layer surface or the back layer surface, preferably to the back surface layer. To stick the RF-ID tag and the thermoreversible recording medium together, a known adhesive or tackiness agent may be used.

Additionally, the thermoreversible recording medium and the RF-ID tag may be integrally formed by lamination or the like and then formed into a card shape or a tag shape.

EXAMPLES

Hereinafter, Examples of the present invention will be explained. However, it should be noted that the present invention is not confined to these Examples in any way.

Production Example 1

Production of Thermoreversible Recording Medium

A thermoreversible recording medium in which color tone reversibly changes by heat was produced in the following manner.

—Support—

As a support, a white turbid polyester film (TETORON FILM U2L98W, manufactured by Teijin DuPont Films Japan Limited) having a thickness of 125 μm was used.

—Under Layer—

Thirty (30) parts by mass of a styrene-butadiene copolymer (PA-9159, manufactured by Nippon A&L Inc.), 12 parts by mass of a polyvinyl alcohol resin (POVAL PVA103, manufactured by Kuraray Co., Ltd.), 20 parts by mass of hollow particles (MICROSPHERE R-300, manufactured by Matsumoto Yushi-Seiyaku Co., Ltd.) and 40 parts by mass of water were mixed, and stirred for approximately 1 hr so as to be uniformly mixed, thereby preparing an under layer coating solution.

Next, the obtained under layer coating solution was applied onto the support with the use of a wire bar, then heated and dried at 80° C. for 2 min, thereby forming an under layer having a thickness of 20 μm.

—Thermoreversible Recording Layer (Recording Layer)—

Using a ball mill, 5 parts by mass of a reversible developer represented by Structural Formula (1) below, 0.5 parts by mass each of the two types of color erasure accelerators represented by Structural Formulae (2) and (3) below, 10 parts by mass of a 50 mass % acrylpolyol solution (hydroxyl value=200 mgKOH/g), and 80 parts by mass of methyl ethyl ketone were pulverized and dispersed such that the average particle diameter became approximately 1 μm.

Structural Formula (1)

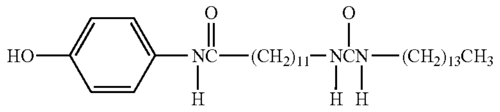

(Reversible Developer)

Structural Formula (2)

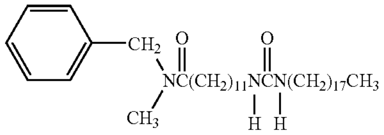

(Color Erasure Accelerator)

Structural Formula (3)

$C_{17}H_{35}CONHC_{18}H_{35}$

Next, into the dispersion solution in which the reversible developer had been pulverized and dispersed, 1 part by mass of 2-anilino-3-methyl-6-dibutylaminofluoran as a leuco dye, 0.2 parts by mass of a phenolic antioxidant (IRGANOX 565, manufactured by Ciba Specialty Chemicals plc.) represented by Structural Formula (4) below, and 5 parts by mass of an isocyanate (CORONATE HL, manufactured by Nippon Polyurethane Industry Co., Ltd.) were added, and then sufficiently stirred.

Structural Formula (4)

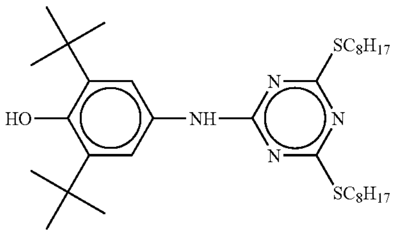

Next, in the obtained solution, 0.02% by mass of a phthalocyanine photothermal conversion material (IR-14, manufactured by NIPPON SHOKUBAI Co., Ltd.) was added, and sufficiently stirred to prepare a recording layer coating solution. The prepared recording layer coating solution was applied, using a wire bar, to the support over which the under layer had already been formed, and then dried at 100° C. for 2 min, then cured at 60° C. for 24 hr so as to form a recording layer having a thickness of 11 μm.

—Intermediate Layer—

Three (3) parts by mass of a 50 mass % acrylpolyol resin solution (LR327, manufactured by Mitsubishi Rayon Co., Ltd.), 7 parts by mass of a 30 mass % zinc oxide fine particle dispersion solution (ZS303, manufactured by Sumitomo Cement Co., Ltd.), 1.5 parts by mass of an isocyanate (CORONATE HL, manufactured by Nippon Polyurethane Industry Co., Ltd.), and 7 parts by mass of methyl ethyl ketone were mixed, and sufficiently stirred to prepare an intermediate layer coating solution.

Next, the intermediate layer coating solution was applied, using a wire bar, to the support over which the under layer and the recording layer had already been formed, and then was heated and dried at 90° C. for 1 min, and then heated at 60° C. for 2 hr so as to form an intermediate layer having a thickness of 2 μm.

—Protective Layer—

Three (3) parts by mass of pentaerythritol hexaacrylate (KAYARAD DPHA, manufactured by Nippon Kayaku Co., Ltd.), 3 parts by mass of an urethane acrylate oligomer (ART RESIN UN-3320HA, manufactured by Negami Chemical Industrial Co., Ltd.), 3 parts by mass of an acrylic acid ester of dipentaerythritol caprolactone (KAYARAD DPCA-120, manufactured by Nippon Kayaku Co., Ltd.), 1 part by mass of a silica (P-526, manufactured by Mizusawa Industrial Chemicals, Ltd.), 0.5 parts by mass of a photopolymerization initiator (IRGACURE 184, manufactured by Nihon Ciba-Geigy K.K.), and 11 parts by mass of isopropyl alcohol were mixed, and sufficiently stirred and dispersed by the use of a ball mill, such that the average particle diameter became approximately 3 thereby preparing a protective layer coating solution.

Next, the protective layer coating solution was applied, using a wire bar, to the support over which the under layer, the recording layer and the intermediate layer had already been formed, and the intermediate layer coating solution was heated and dried at 90° C. for 1 min, and then cross-linked by means of an ultraviolet lamp of 80 W/cm, so as to form a protective layer having a thickness of 4 μm.

—Back Layer—

Pentaerythritol hexaacrylate (KAYARAD DPHA, manufactured by Nippon Kayaku Co., Ltd.) (7.5 parts by mass), 2.5 parts by mass of an urethane acrylate oligomer (ART RESIN UN-3320HA, manufactured by Negami Chemical Industrial Co., Ltd.), 2.5 parts by mass of a needle-like conductive titanium oxide (FT-3000, major axis=5.15 μm, minor axis=0.27 μm, structure: titanium oxide coated with antimony-doped tin oxide; manufactured by Ishihara Sangyo Kaisha, Ltd.), 0.5 parts by mass of a photopolymerization initiator (IRGACURE 184, manufactured by Nihon Ciba-Geigy K.K.) and 13 parts by mass of isopropyl alcohol were mixed, and sufficiently stirred by the use of a ball mill, so as to prepare a back layer coating solution.

Next, the back layer coating solution was applied, using a wire bar, to the surface of the support opposite to the surface thereof over which the recording layer, the intermediate layer and the protective layer had already been formed, and heated and dried at 90° C. for 1 min, and then cross-linked by means of an ultraviolet lamp of 80 W/cm, so as to form a back layer having a thickness of 4 μm. Thus, a thermoreversible recording medium of Production Example 1 was produced.

Production Example 2

Production of Thermoreversible Recording Medium

A thermoreversible recording medium was produced in the same manner as in Production Example 1, except that the phthalocyanine photothermal conversion material was replaced with 0.005% by mass of a cyanine photothermal conversion material (YKR-2900 manufactured by Yamamoto Chemicals, Inc.) as the photothermal conversion material, and sufficiently stirred to prepare a recording layer coating solution. Here, the amount of the cyanine photothermal conversion material YKR-2900 was added so that the range of the energy density which could erase the image became similar to that of the thermoreversible recording medium of Production Example 1.

(Evaluation Method)

<Measurement of Image and Background Density>

The image and background density was measured by 938 Spectrodensitometer manufactured by X-rite.

<Evaluation of Background Fog>

The background fog was measured in such a manner that a difference between a background density value before an image processing was performed, i.e. 0.15 and a background density value of a part where images were repeatedly erased was obtained as a background fog value. The background fog value is preferably 0.04 or less. When the background fog value is more than 0.04, a clear contrast image may not be obtained.

<Evaluation of Residual Image Density>

The residual image density was obtained from a difference in density between a repeatedly erased part and a repeatedly image processed part. The residual image density is preferably 0.02 or less. When the residual image density is more than 0.02, the residual image stands out.

<Measurement of Light Intensity Distribution of Laser Light>

A light intensity distribution of the laser light was measured as follows:

When a semiconductor laser device was used as a laser, a laser beam analyzer (SCORPION SCOR-20SCM, manufactured by Point Grey Research, Inc.) was positioned so that the emitting distance was to be identical to the distance when an image was formed on a thermoreversible recording medium, and then the intensity of laser light was measured by the laser beam analyzer by reducing light using a beam splitter (BEAMSTAR-FX-BEAM SPLITTER, manufactured by Ophir Optronics Ltd.) that was a combination of a transmissive mirror and a filter so that the output of the laser was adjusted to be $3\times10^{-6}$. Then, the obtained intensity of the laser light was profiled on a three-dimensional graph to thereby obtain a light intensity distribution of the laser light.

(Evaluation Test 1)

<Image Formation>

An image was formed on the thermoreversible recording medium produced in Production Example 1 using a semiconductor laser LIMO25-F100-DL808 (manufactured by LIMO; center wavelength: 808 nm), which was adjusted so that an output of the laser beam was 10 W, an irradiation distance was 152 mm, a linear velocity was 1,000 mm/s, and $I_1/I_2$ was 1.7.

<Image Erasure>

The semiconductor laser LIMO25-F100-DL808 (manufactured by LIMO; center wavelength: 808 nm) was adjusted so that an irradiation distance was 200 mm, a linear velocity was 500 mm/s, and a spot diameter was 3.0 mm. Using the semiconductor laser, the image was erased by linearly scanning the thermoreversible recording medium produced in Production Example 1 with laser lights at 0.5 mm interval.

(Evaluation Result 1)

Figure 12:
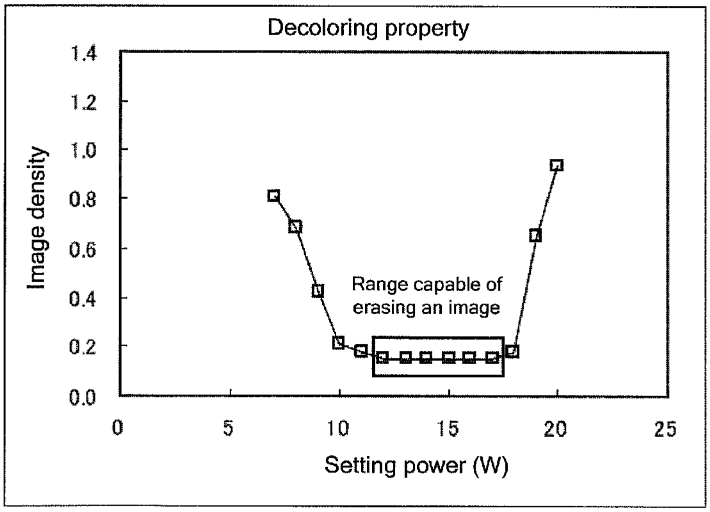
FIG. 12 is a diagram showing Evaluation Result 1.
Figure 13:
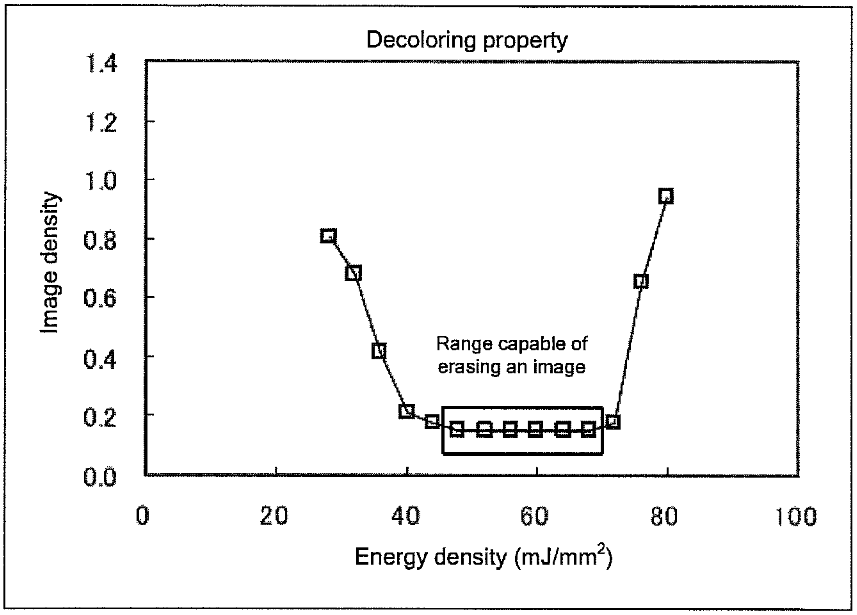
FIG. 13 is another diagram showing Evaluation Result 1.

The decoloring property of the Evaluation Test 1 is shown in FIGS. 12 and 13.

The minimum energy density value which could erase the image was 48 mJ/mm$^2$, the maximum energy density value which could erase the image was 68 mJ/mm$^2$ (an output which could erase the image was 12 W to 17 W), namely, the range of the energy density which could erase the image was 20 mJ/mm$^2$, and a center value of the range was 58 mJ/mm$^2$.

(Evaluation Test and Result 2)

<Repetitive Erasure>

As each of Examples 1 to 6 and Comparative Examples 1 to 3, an image was formed on the thermoreversible recording medium produced in Production Example 1 in the same manner as in Evaluation Test 1. The semiconductor laser LIMO25-F100-DL808 (manufactured by LIMO; center wavelength: 808 nm) was adjusted so that an irradiation distance was 200 mm, a linear velocity was 500 mm/s, and a spot diameter was 3.0 mm. Using the semiconductor laser, the thermoreversible recording medium was linearly scanned with laser lights at 0.5 mm interval with the output of the laser light as shown in Table 1, so as to perform repetitive erasure in a part where no image was formed, i.e. a repeatedly erased part, and then the background fog in this part was measured. The results are shown in Table 1.

It is noted that the repetitive erasure was performed for measurement of the background fog in such a manner that a part where no image was formed in a medium was repeatedly irradiated with a laser light with an energy density in a range which could erase an image.

<Repetitive Image Processing>

The image processing was performed on each of the thermoreversible recording media in such a manner that the image formation under the conditions of Evaluation Test 1 and the image erasure under the conditions of Examples 1 to 6 and Comparative Examples 1 to 3 were performed. The residual image density after the image processing was repeated 1 time and the residual image density after the image processing was repeated 300 times were respectively evaluated in a repeatedly image processed part. The results of each measured residual image density are shown in Table 1. Here, the image processing was performed in the order of the image formation and the image erasure. When the image formation and the image erasure were respectively performed one time, the number of repetition time was counted as one.

Moreover, as Reference Example 1, an image was formed on the thermoreversible recording medium produced in Production Example 1 in the same manner as in Evaluation Test 1. A $CO_2$ laser LP-440 (manufactured by SUNX Limited) was adjusted so that an irradiation distance was 224 mm, a linear velocity was 1,750 mm/s, and a spot diameter was 3.0 mm. Using the $CO_2$ laser LP-440, the thermoreversible recording medium was linearly scanned with laser lights at 0.5 mm interval with an energy density of 30 mJ/mm$^2$ (26.5 W) which was a center value in the range which could erase the image (25 mJ/mm$^2$ to 35 mJ/mm$^2$), so as to perform the repetitive erasure and the repetitive image processing. Then, the background fog in a repeatedly erased part and the residual image density in a repeatedly image processed part were respectively measured.

As Reference Example 2, an image was formed on the thermoreversible recording medium produced in Production Example 1 in the same manner as in Evaluation Test 1. Using a thermal printing simulator (manufactured by Yashiro Seisakusho; a pulse width of 2 ms, a line period of 2.86 ms, a velocity of 43.10 mm/s, a vertical scanning density of 8 dot/mm) equipped with an end face-type thermal head EUX-ET8A9AS1 (manufactured by Matsushita Electronic Components Co., Ltd.; a resistance value of 1,152Ω), the repetitive erasure and the repetitive image processing were performed on the thermoreversible recording medium, with an energy density of 17.5 mJ/mm$^2$ which was a center value in the range which could erase the image (14.1 mJ/mm$^2$ to 21.1 mJ/mm$^2$). Then, the background fog in a repeatedly erased part and the residual image density in a repeatedly image processed part were respectively measured.

The results are shown in Table 1. In Table 1, "Possible" means a laser output or energy within a range where the image could be erased, and "Impossible" means a laser output or energy outside a range where the image could be erased.

TABLE 1

| | | | | Background fog | | Residual image density | |
|---|---|---|---|---|---|---|---|
| | Laser output W | Energy density mJ/mm$^2$ | Image erasure | After 1 time | After 300 times | After 1 time | After 300 times |
| Example 1 | 13.2 | 52.8 | Possible | 0.000 | 0.019 | 0.000 | 0.010 |
| Example 2 | 13.3 | 53.2 | Possible | 0.000 | 0.020 | 0.000 | 0.010 |
| Example 3 | 12.5 | 50 | Possible | 0.000 | 0.012 | 0.000 | 0.016 |
| Example 4 | 14.0 | 56 | Possible | 0.000 | 0.032 | 0.000 | 0.007 |
| Example 5 | 12.0 | 48 | Possible | 0.000 | 0.009 | 0.000 | 0.021 |
| Example 6 | 14.5 | 58 | Possible | 0.000 | 0.038 | 0.000 | 0.005 |
| Comparative Example 1 | 15.0 | 60 | Possible | 0.000 | 0.085 | 0.000 | 0.004 |
| Comparative Example 2 | 11.5 | 46 | Impossible | 0.000 | 0.000 | 0.000 | 0.000 |
| Comparative Example 3 | 17.5 | 70 | Impossible | 0.000 | 0.235 | 0.000 | 0.001 |
| Reference Example 1 | 26.5 | 30 | Possible | 0.000 | 0.020 | 0.000 | 0.018 |
| Reference Example 2 | — | 17.5 | Possible | 0.000 | 0.022 | 0.000 | 0.020 |

(Evaluation Test and Result 3)

<Repetitive Erasure>

As each of Examples 7 to 10, and Comparative Examples 4 to 6, an image was formed on the thermoreversible recording medium produced in Production Example 1 in the same manner as in Evaluation Test 1. The semiconductor laser LIMO25-F100-DL808 (manufactured by LIMO; center wavelength: 808 nm) was adjusted so that an irradiation distance was 200 mm, an output of a laser light was 13.25 W, and a spot diameter was 3.0 mm. Using the semiconductor laser, the thermoreversible recording medium was linearly scanned with laser lights at 0.5 mm interval, at a scanning velocity of the laser light as shown in Table 2, so as to perform repetitive erasure in a part where no image was formed, i.e. a repeatedly erased part, and then the background fog in this part was measured. The results are shown in Table 2.

<Repetitive Image Processing>

The image processing was performed on each of the thermoreversible recording media in such a manner that the image formation under the conditions of Evaluation Test 1 and the image erasure under the conditions of Examples 7 to 10 and Comparative Examples 4 to 6 were performed. The residual image density after the image processing was repeated 1 time and the residual image density after the image processing was repeated 300 times were respectively evaluated in a repeatedly image processed part. The results of each measured residual image density are shown in Table 2. Here, the image processing was performed in the order of the image formation and the image erasure. When the image formation and the image erasure were respectively performed one time, the number of repetition time was counted as one.

In Table 2, "Possible" means a laser output or energy within a range where the image could be erased, and "Impossible" means a laser output or energy outside a range where the image could be erased.

TABLE 2

| | Laser linear velocity mm/s | Energy density $mJ/mm^2$ | Image erasure | Background fog After 1 time | Background fog After 300 times | Residual image density After 1 time | Residual image density After 300 times |
|---|---|---|---|---|---|---|---|
| Example 7 | 502 | 52.8 | Possible | 0.000 | 0.019 | 0.000 | 0.010 |
| Example 8 | 498 | 53.2 | Possible | 0.000 | 0.020 | 0.000 | 0.009 |
| Example 9 | 530 | 50 | Possible | 0.000 | 0.012 | 0.000 | 0.014 |
| Example 10 | 470 | 56 | Possible | 0.000 | 0.032 | 0.000 | 0.005 |
| Comparative Example 4 | 440 | 60 | Possible | 0.000 | 0.085 | 0.000 | 0.004 |
| Comparative Example 5 | 570 | 47 | Impossible | 0.000 | 0.000 | 0.000 | 0.000 |
| Comparative Example 6 | 380 | 70 | Impossible | 0.000 | 0.235 | 0.000 | 0.001 |

(Evaluation Test and Result 4)

<Image Formation>

Each of the thermoreversible recording media produced in Production Example 1 and Production Example 2 was irradiated with a laser light at an output of 10 W, with changing a linear velocity and a laser irradiation distance from the fθ lens to the thermoreversible recording medium depending on each Example, so as to form an image at a constant energy density and a varied light intensity distribution $I_1/I_2$ as shown in Table 3, using the semiconductor laser LIMO25-F100-DL808 (manufactured by LIMO; center wavelength: 808 nm).

<Image Erasure>

The image erasure of each of Examples 1, 11 and 12 was performed as follows. The semiconductor laser LIMO25-F100-DL808 (manufactured by LIMO; center wavelength: 808 nm) was adjusted so that an output of a laser light was 13.25 W, an irradiation distance was 200 mm, a linear velocity was 500 mm/s and a spot diameter was 3.0 mm. Using the semiconductor laser, the image was erased by linearly scanning either the thermoreversible recording medium produced in Production Example 1 or that in Production Example 2, on which the image had been formed, with laser lights at 0.5 mm interval (energy density: 53 $mJ/mm^2$).

<Repetitive Image Processing>

Under the conditions of the above-described image formation and image erasure, the image processing was performed on each of the thermoreversible recording media, and decoloring properties after the image processing was repeated 100 times and decoloring properties after the image processing was repeated 300 times were respectively evaluated. Here, the image processing was performed in the order of the image formation and the image erasure. When the image formation and the image erasure were respectively performed one time, the number of repetition time was counted as one.

The results are shown in Table 3. In Table 3, the medium on which image processing had been repeatedly performed was visually observed and evaluated as follows: "A" means an image was completely erased, and "B" means a residual image was observed.

TABLE 3

| | Thermo-reversible recording medium | Light intensity distribution $I_1/I_2$ | Image erasure after repetitive image processing: Repeat 1 time | Repeat 100 times | Repeat 300 times |
|---|---|---|---|---|---|
| Example 1 | Production Example 1 | 1.7 | A | A | A |
| Example 11 | Production Example 1 | 2.3 | A | A | B |
| Example 12 | Production Example 2 | 1.7 | A | B | B |

The number of repetition time which could erase the image on the thermoreversible recording medium produced in Production Example 2 was less than that on the thermoreversible recording medium produced in Production Example 1.

Moreover, in Example 13, the thermoreversible recording medium of Production Example 1 was attached on a plastic container, and image processing was performed on the thermoreversible recording medium in the same manner as in Example 1, while the plastic container was moved on a conveyer at a traveling speed of 10 m/min. The result same as that of Example 1 was obtained.

(Evaluation Test and Result 5)

<Repetitive Erasure>

As each of Examples 14 to 17, and Comparative Examples 7 to 9, an image was formed on the thermoreversible recording medium produced in Production Example 1 in the same manner as in Evaluation Test 1. An optical lens was arranged in a path of a laser light emitted from a LD bar as a light source of a semiconductor laser, JOLD-55-CPFW-1L (manufactured by JENOPTIK AG; center wavelength: 808 nm) so as to form a line-shaped light beam (1.5 mm in width and 50 mm in length), and the semiconductor laser was adjusted so that an irradiation distance was 150 mm, and a linear velocity was 15 mm/s Using the semiconductor laser, JOLD-55-CPFW-1L, the thermoreversible recording medium was linearly scanned with the laser light with an energy density in a range which could erase the image (48 $mJ/mm^2$ to 68 $mJ/mm^2$), and the output of the laser light as shown in Table 4, so as to perform repetitive erasure in a part where no image was formed, i.e. a repeatedly erased part, and then the background fog in this part was measured. The results are shown in Table 4.

<Repetitive Image Processing>

The image processing was performed on each of the thermoreversible recording media in such a manner that the image formation under the conditions of Evaluation Test 1 and the image erasure under the conditions of Examples 14 to 17 and Comparative Examples 7 to 9 were performed. The residual image density after the image processing was repeated 1 time and the residual image density after the image processing was repeated 300 times were respectively evaluated in a repeatedly image processed part. The results of each measured residual image density are shown in Table 4. Here, the image processing was performed in the order of the image formation and the image erasure. When the image formation and the image erasure were respectively performed one time, the number of repetition time was counted as one.

TABLE 4

| | Laser output W | Energy density mJ/mm$^2$ | Image erasure | Background fog After 1 time | Background fog After 300 times | Residual image density After 1 time | Residual image density After 300 times |
|---|---|---|---|---|---|---|---|
| Example 14 | 39.6 | 52.8 | Possible | 0.000 | 0.012 | 0.000 | 0.008 |
| Example 15 | 39.9 | 53.2 | Possible | 0.000 | 0.014 | 0.000 | 0.009 |
| Example 16 | 37.5 | 50 | Possible | 0.000 | 0.010 | 0.000 | 0.016 |
| Example 17 | 42 | 56 | Possible | 0.000 | 0.018 | 0.000 | 0.004 |
| Comparative Example 7 | 45 | 60 | Possible | 0.000 | 0.074 | 0.000 | 0.003 |
| Comparative Example 8 | 35.3 | 47 | Impossible | 0.000 | 0.000 | 0.000 | 0.000 |
| Comparative Example 9 | 52.5 | 70 | Impossible | 0.000 | 0.210 | 0.000 | 0.001 |

Test results will be explained.

As can be seen from the respective comparison of Examples 1 to 6 with Comparative Examples 1 to 3, when the energy density is adjusted to the range which can erase the image and a center value or less of the range, the background fog can be inhibited, thereby obtaining a clear contrast image.

In Comparative Examples 2 and 3, the energy density is outside the range which can erase the image, and problems occur, for example, an image can not be erased, an image is colored, or the like.

As can be seen from the respective comparison of Example 6 with Reference Examples 1 and 2, the ranges of the energy density which can erase the image are different. It is found that influence on the thermoreversible recording medium differs between a method of erasing an image on the thermoreversible recording medium using the semiconductor laser and the method of erasing an image on the thermoreversible recording medium using the $CO_2$ laser or thermal head.

As can be seen from the respective comparison of Examples 7 to 10 with Comparative Examples 4 to 6, when the energy density is adjusted to the range which can erase the image and a center value or less of the range, the background fog can be inhibited, thereby obtaining a clear contrast image. In Comparative Examples 4 and 5, the energy density is outside the range which can erase the image, problems occur, for example, an image can not be erased, an image is colored, or the like.

As can be seen from the comparison of Example 1 with Example 11, when a light intensity of an irradiated laser light upon image formation satisfies the relationship of $0.40 \leqq I_1/I_2 \leqq 2.00$, the thermoreversible recording medium may not deteriorate even though the image processing is repeated, thereby uniformly erasing the image.

As can be seen from the comparison of Example 1 and Example 12, by the use of the phthalocyanine photothermal conversion material, the photothermal conversion material may not deteriorate even though the image processing is repeated, thereby uniformly erasing the image.

As can be seen from Example 13, when the image processing is repeatedly performed on a moving object, the image on the thermoreversible recording medium can be uniformly erased, and the background fog can be inhibited, thereby obtaining a clear contrast image.

As can be seen from the respective comparison of Examples 14 to 17 with Comparative Examples 7 to 9, when the energy density is adjusted to the range which can erase the image and a center value or less of the range, the background fog can be inhibited, thereby obtaining a clear contrast image. The result obtained in the case where an image is erased by a laser light without overlapping in the image erasing step is the same as that obtained in the case where an image is erased by overlapping laser lights in the image erasing step.

The image erasing method and image erasing device of the present invention can repeatedly perform image forming and image erasing to a thermoreversible recording medium such as a label attached to a container such as a cardboard box or a plastic container in a non-contact system. In addition, the image erasing method and image erasing device of the present invention can inhibit the background fog on the thermoreversible recording medium due to the repetitive erasure, thereby obtaining a clear contrast image. For this reason, the image erasing method and image erasing device of the present invention are especially suitably used for distribution and delivery systems.

What is claimed is:

1. A method for erasing an image comprising:

irradiating an image formed on a thermoreversible recording medium with a laser light having a wavelength of 700 nm to 1,500 nm so as to erase the image, wherein an energy density of the laser light is in a range of the energy density which can erase the image and a center value or less of the range of the energy density, wherein the image is erased with an energy density of 1 to 4, provided that a minimum energy density value for the image to be erased is 0, and a maximum energy density value for the image to be erased is 10, wherein the energy density is changed by a method of changing an output of the laser light or a scanning linear velocity of the laser light, and wherein the thermoreversible recording medium comprises:

a support; and a thermoreversible recording layer on the support; and wherein the thermoreversible recording layer contains a leuco dye serving as an electron-donating color-forming compound and a reversible developer serving as an electron-accepting compound, in which color tone reversibly changes by heat, and at least one of the thermoreversible recording layer and a layer adjacent to the thermoreversible recording layer contains a photothermal conversion material, which absorbs the light and converts the light into heat.

2. The method for erasing an image according to claim 1, wherein a laser light source used in the irradiating the image is a semiconductor laser.

3. The method for erasing an image according to claim 1, wherein the photothermal conversion material in the thermoreversible recording medium is a material having an absorption peak in a near infrared region.

4. The method for erasing an image according to claim 1, wherein the thermoreversible recording medium is irradiated with the laser light so as to form the image thereon, and a light intensity $I_1$ of the center portion and a light intensity $I_2$ at the 80% plane of a total irradiation energy of the laser light in a light intensity distribution satisfy the relationship of $0.40 \leqq I_1/I_2 \leqq 2.00$.

5. The method for erasing an image according to claim 1, wherein the image on the thermoreversible recording medium is erased while the thermoreversible recording medium is moved.

6. The method for erasing an image according to claim 1, wherein an output of the laser light applied in the irradiating the image is 5 W to 200 W.

7. The method for erasing an image according to claim 1, wherein a scanning velocity of the laser light applied in the irradiating the image is 100 mm/s to 20,000 mm/s.

8. The method for erasing an image according to claim 1, wherein a spot diameter of the laser light applied in the irradiating the image is 0.5 mm to 14 mm.

* * * * *